(12) United States Patent
Nishijima

(10) Patent No.: US 8,439,270 B2
(45) Date of Patent: May 14, 2013

(54) SEMICONDUCTOR DEVICE AND WIRELESS TAG USING THE SAME

(75) Inventor: Tatsuji Nishijima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 825 days.

(21) Appl. No.: 12/558,156

(22) Filed: Sep. 11, 2009

(65) Prior Publication Data
US 2010/0072285 A1 Mar. 25, 2010

(30) Foreign Application Priority Data

Sep. 19, 2008 (JP) .................................. 2008-241499

(51) Int. Cl.
G06K 19/06 (2006.01)
H01L 29/66 (2006.01)
H02H 3/20 (2006.01)

(52) U.S. Cl.
USPC ............................ 235/492; 361/91.1; 257/173

(58) Field of Classification Search .................. 235/492; 361/91.1; 257/173
See application file for complete search history.

(56) References Cited

U.S. PATENT DOCUMENTS

| | | | |
|---|---|---|---|
| 5,652,423 A * | 7/1997 | Saitoh et al. .................. | 235/492 |
| 5,736,728 A | 4/1998 | Matsubara | |
| 6,097,292 A | 8/2000 | Kelly et al. | |
| 6,427,065 B1 | 7/2002 | Suga et al. | |
| 6,799,015 B1 | 9/2004 | Tiwari | |
| 6,879,809 B1 | 4/2005 | Vega et al. | |
| 7,443,135 B2 | 10/2008 | Cho | |
| 7,703,677 B2 | 4/2010 | Alihodzic | |
| 2005/0122651 A1 | 6/2005 | Fischer et al. | |
| 2005/0161508 A1 | 7/2005 | Akaida et al. | |
| 2005/0280509 A1 | 12/2005 | Tanaka et al. | |
| 2005/0282505 A1 | 12/2005 | Umeda et al. | |
| 2006/0044726 A1 * | 3/2006 | Sakata et al. .................. | 361/100 |

(Continued)

FOREIGN PATENT DOCUMENTS

| | | |
|---|---|---|
| EP | 0 689 149 A1 | 12/1995 |
| JP | 6-6272 | 1/1994 |

(Continued)

OTHER PUBLICATIONS

International Search Report re application No. PCT/JP2009/065141, dated Oct. 20, 2009.

(Continued)

Primary Examiner — Michael G Lee
Assistant Examiner — Laura Gudorf
(74) Attorney, Agent, or Firm — Husch Blackwell LLP

(57) ABSTRACT

In a wireless tag with which a wireless communication system whose electric power of a carrier wave from a R/W is high, an overvoltage protection circuit is provided to prevent from generating excessive electric power in the wireless tag when the wireless tag receives excessive electric power. However, as noise is generated by operation of the overvoltage protection circuit, an error of reception occurs in receiving a signal whose modulation factor is small. To solve the problem, the maximum value of generated voltage in the wireless tag is held in a memory circuit after the overvoltage protection circuit operates, then the overvoltage protection circuit is controlled in accordance with the maximum value of generated voltage. The voltages at which the overvoltage protection circuit starts and stops operating are different from each other, and hysteresis occurs between the timing when the overvoltage protection circuit starts and stops operating.

14 Claims, 14 Drawing Sheets

U.S. PATENT DOCUMENTS

| | | |
|---|---|---|
| 2006/0116968 A1 | 6/2006 | Arisawa |
| 2006/0128345 A1 | 6/2006 | Ootaka et al. |
| 2006/0133545 A1 | 6/2006 | Kunc et al. |
| 2006/0164215 A1 | 7/2006 | Kofler |
| 2008/0094180 A1 | 4/2008 | Kato et al. |
| 2008/0285199 A1* | 11/2008 | Deutschmann et al. ...... 361/111 |

FOREIGN PATENT DOCUMENTS

| | | |
|---|---|---|
| JP | 10-285087 | 10/1998 |
| JP | 11-88243 | 3/1999 |
| JP | 2002-259921 | 9/2002 |
| JP | 2003-85506 | 3/2003 |
| JP | 2005-63123 | 3/2005 |
| JP | 2006-180073 | 7/2006 |
| JP | 2007-183790 | 7/2007 |

OTHER PUBLICATIONS

Written Opinion re application No. PCT/JP2009/065141, dated Oct. 20, 2009.

* cited by examiner

| R/W input current (mA) | conventional structure (Fig. 4) | | | present invention (Fig. 3) | | |
|---|---|---|---|---|---|---|
| | VppMax (V) | VppMin (V) | modulation rate (%) | VppMax (V) | VppMin (V) | modulation rate (%) |
| 20 | 1.932 | 1.370 | 17.0 | 1.920 | 1.351 | 17.4 |
| 25 | 2.291 | 1.615 | 17.3 | 2.310 | 1.611 | 17.8 |
| 30 | 2.527 | 1.868 | 15.0 | 2.564 | 1.855 | 16.1 |
| 35 | 2.730 | 2.077 | 13.6 | 2.825 | 2.079 | 15.2 |
| 40 | 2.958 | 2.287 | 12.8 | 3.131 | 2.310 | 15.1 |
| 50 | 3.353 | 2.655 | 11.6 | 3.683 | 2.764 | 14.3 |
| 60 | 3.683 | 2.963 | 10.8 | 4.134 | 3.191 | 12.9 |
| 80 | 4.234 | 3.477 | 9.8 | 4.806 | 3.869 | 10.8 |
| 100 | 4.717 | 3.867 | 9.9 | 5.347 | 4.393 | 9.8 |
| 150 | 5.723 | 4.702 | 9.8 | 6.495 | 5.345 | 9.7 |
| 200 | 6.341 | 5.400 | 8.0 | 6.767 | 5.517 | 10.2 |
| 300 | 6.796 | 6.110 | 5.3 | 7.021 | 5.557 | 11.6 |
| 400 | 7.075 | 6.411 | 4.9 | 7.226 | 5.442 | 14.1 |
| 600 | 7.534 | 6.777 | 5.3 | 7.671 | 4.762 | 23.4 |

| R/W input electric power [dBm] | Venv [V] | R/W → tag 100% modulation | | | | R/W → tag 10% modulation | | | |
|---|---|---|---|---|---|---|---|---|---|
| | | dual subcarrier wave | | single subcarrier wave | | dual subcarrier wave | | single subcarrier wave | |
| | | 1 out of 4 | 1 out of 256 | 1 out of 4 | 1 out of 256 | 1 out of 4 | 1 out of 256 | 1 out of 4 | 1 out of 256 |
| 15.9 | 2.995 | 100 | 100 | 70 | 40 | 100 | 100 | 70 | 60 |
| | 3.189 | 100 | 100 | 80 | 50 | 100 | 100 | 90 | 65 |
| | 3.374 | 100 | 100 | 60 | 65 | 100 | 100 | 50 | 60 |
| | 3.533 | 100 | 100 | 60 | 55 | 100 | 100 | 60 | 55 |
| | 3.705 | 100 | 100 | 50 | 30 | 100 | 100 | 35 | 45 |
| 17.6 | 3.907 | 100 | 100 | 40 | 35 | 100 | 100 | 20 | 50 |
| | 4.143 | 100 | 100 | 45 | 35 | 100 | 100 | 45 | 60 |
| | 4.337 | 100 | 100 | 50 | 50 | 100 | 100 | 50 | 45 |
| | 4.424 | 100 | 100 | 55 | 50 | 100 | 100 | 40 | 35 |
| | 4.468 | 100 | 100 | 50 | 70 | 100 | 100 | 55 | 25 |
| 19.3 | 4.525 | 100 | 100 | 30 | 45 | 100 | 100 | 40 | 30 |
| | 4.557 | 100 | 100 | 50 | 45 | 100 | 100 | 50 | 70 |
| | 4.572 | 100 | 100 | 40 | 65 | 100 | 100 | 55 | 40 |
| | 4.597 | 100 | 100 | 65 | 35 | 100 | 100 | 55 | 45 |
| | 4.627 | 100 | 100 | 50 | 55 | 100 | 100 | 45 | 50 |
| 21.0 | 4.648 | 100 | 100 | 45 | 55 | 100 | 100 | 55 | 70 |
| | 4.647 | 100 | 100 | 45 | 45 | 100 | 100 | 30 | 35 |
| | 4.647 | 100 | 100 | 40 | 20 | 100 | 100 | 45 | 30 |
| | 4.682 | 100 | 100 | 40 | 15 | 100 | 100 | 35 | 35 |
| | 4.696 | 100 | 100 | 40 | 30 | 100 | 100 | 40 | 30 |
| 22.7 | 4.704 | 100 | 100 | 65 | 25 | 100 | 100 | 35 | 25 |

1101

1102

1103

1104a 1104b 1104c 1104d 1104e 1104f 1104g

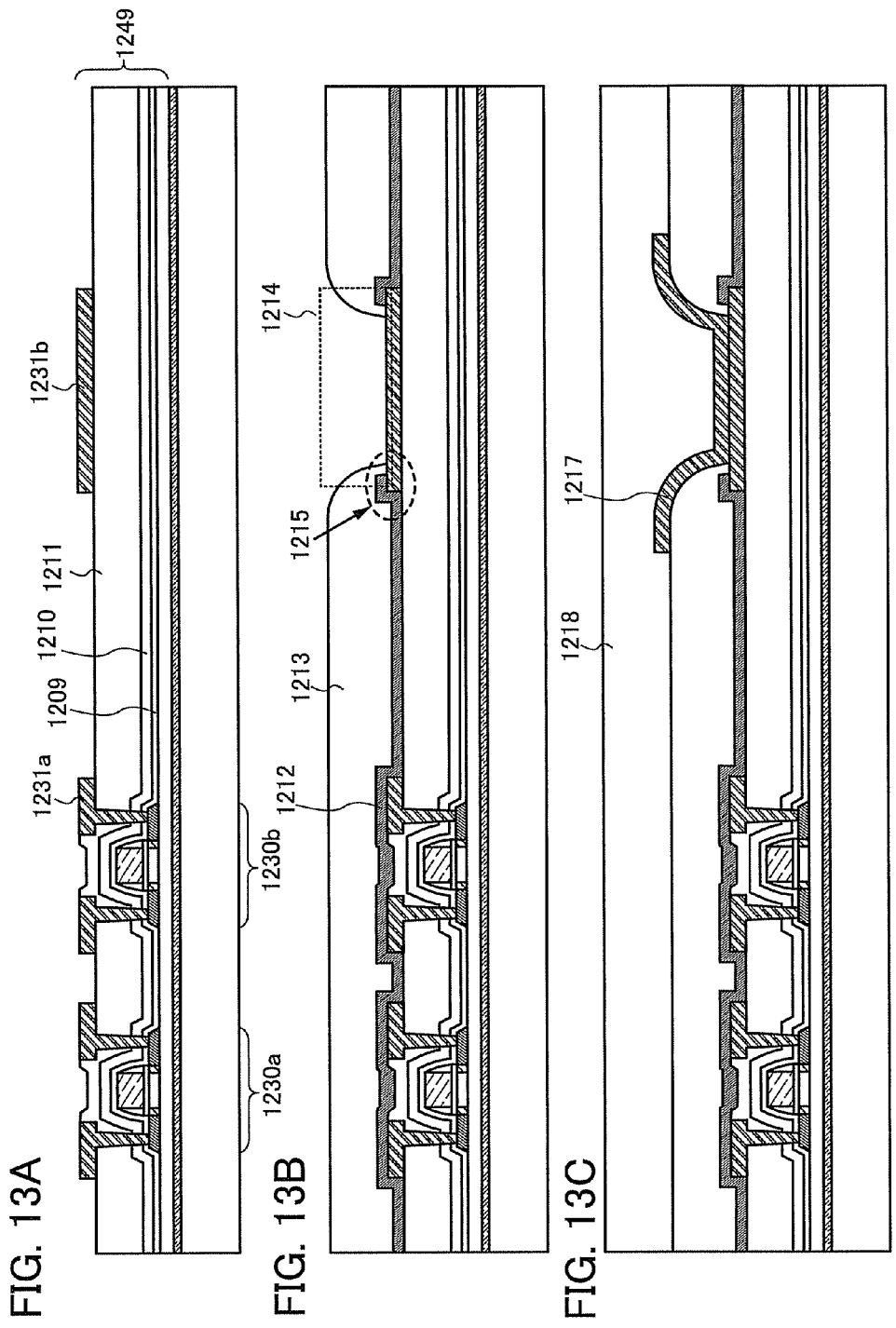

SEMICONDUCTOR DEVICE AND WIRELESS TAG USING THE SAME

TECHNICAL FIELD

The present invention relates to a wireless tag which transmits and receives data using wireless communication. In particular, the present invention relates to a structure of an overvoltage protection circuit which prevents breakdown of a wireless communication circuit, or prevents deterioration or breakdown of an element included in the circuit in the case where a large amount of electric power is received in wireless communication.

BACKGROUND ART

In recent years, an individual identification technology using wireless communication (hereinafter referred to as a wireless communication system) has attracted attention. In particular, as a data carrier which transmits and receives data by wireless communication, an individual identification technology with a wireless tag (hereinafter collectively referred to as a "wireless tag" regardless of the shape such as a card shape or a chip shape) utilizing an RFID (radio frequency identification) technology has attracted attention. The wireless tag is also referred to as an IC tag, an RFID tag, or an electronic tag.

The individual identification technology using the wireless tag has started to be used for management of a large number or a large amount of goods in the field of production and distribution as an alternative to conventional barcode management, and has been developed to be applied to personal authentication.

A wireless communication system herein is a communication system in which data is wirelessly transmitted and received between a transceiver (also referred to as an interrogator) such as a reader/writer (hereinafter referred to as a R/W) and a wireless tag. In such wireless communication, data to be transmitted and received is superimposed on a carrier wave generated from the R/W, whereby data is exchanged.

In some of wireless tags, a DC voltage for driving is generated in the wireless tag by reception of a carrier wave or an amplitude modulation wave generated by superimposing a modulation wave on a carrier wave, from a R/W, and thus, driving electric power of a circuit in the wireless tag is covered. In such a wireless tag, a battery is not provided. Such a wireless tag is generally called a passive type wireless tag. On the other hand, the one covering electric power required for operation as a wireless tag by using a battery incorporated in the wireless tag itself is called an active type wireless tag.

A passive type wireless tag has an advantage in that the size and the weight can be reduced because a battery is not provided; however, by receiving a carrier wave from a R/W, driving electric power is generated, and thus, if the carrier wave is not sufficiently received, electric power required for circuit operation can not be generated.

As factors required in the case where an application is built using such a wireless communication system, a long maximum communication distance, recognition of all the wireless tags in the case where a large number of wireless tags are provided in a specific region, and the like can be given.

Electric power of a carrier wave from a R/W is often increased to achieve the above two factors. Therefore, in the case where a wireless tag is placed very close to the R/W, or in the case where the number of wireless tags which are placed close to the R/W is small, very high electric power is received by the wireless tag.

In the case where excessive electric power is supplied to the wireless tag, a DC voltage which is generated internally is also excessively generated; thus, an element in the wireless tag may be broken because a high voltage is applied to an internal circuit of the wireless tag. Therefore, in a wireless tag with which a wireless communication system whose electric power of a carrier wave from a R/W is high may be constructed, in the case where the wireless tag is present in an environment where excessive electric power is received, an overvoltage protection circuit with which excessive electric power is prevented in the wireless tag may be provided. Such a wireless tag is disclosed in the following Patent Document 1 and Patent Document 2.

[Citation List]
[Patent Document]
[Patent Document 1] Japanese Published Patent Application No. 2006-180073
[Patent Document 2] Japanese Published Patent Application No. 2007-183790

DISCLOSURE OF INVENTION

The above-described overvoltage protection circuit operates in such a manner: when a wireless tag generates a DC voltage in the wireless tag by receiving a carrier wave or an amplitude modulation wave from a R/W, a power supply voltage higher than a desired voltage is not generated when a generated power supply voltage reaches a desired value, so that an excessive power supply voltage is not generated. As an example of such operation, a method in which a path through which excessively generated electric power discharges is made to be formed, a method in which an antenna is made to hardly receive a carrier wave, or the like can be given.

However, in a wireless communication system using a frequency band of, in particular, 13.56 MHz, when a modulation wave is superimposed on a carrier wave, a signal is transmitted and received using an amplification modulation wave in which the difference of modulation factors between a region having large amplitude and a region having small amplitude is about 10% in some cases. As described above, in transmitting and receiving an amplitude modulation wave whose modulation factor is small, noise generated in the periphery of an antenna greatly affects accuracy of transmitting and receiving signals. However, in a region whose received electric power is close to a threshold value at which an overvoltage protection circuit operates, the overvoltage protection circuit repeats operation such as operating and stopping. As a result, noise is input to the signal. These phenomena occur because the overvoltage protection circuit changes the amount of suppression of voltage in accordance with the signal which is transmitted and received by the wireless tag and cancels a signal of an antenna terminal. Such noise causes a communication error between the R/W and the wireless tag.

An object of an embodiment of the present invention is to provide an overvoltage protection circuit having a structure in which an excessive voltage is favorably prevented from being applied to an internal circuit and the operation does not causes noise on a signal which is transmitted and received, in the case where the intensity of received electric power is too high. In addition, another object of an embodiment of the present invention is to provide a wireless tag with which, in a wireless communication system whose electric power of a carrier wave from a R/W is high, normal and stable wireless communication between the R/W and an wireless tag can be performed in a whole region between neighborhood and the maximum communication distance by providing the above-described overvoltage protection circuit and preventing degradation and breakdown of an internal circuit even in a close distance where the wireless tag receives high electric power without decreasing the maximum communication distance.

The following measures are taken in an embodiment of the present invention to achieve the above-described objects.

A semiconductor device which is an embodiment of the present invention includes: a voltage detection circuit which detects a level of electric power supplied from an external portion and outputs a potential in accordance with the level of detected electric power; a memory circuit which holds a potential in accordance with a maximum value of the potential output from the voltage detection circuit; and a protection circuit which changes impedance of a receiving portion of the electric power in accordance with the potential which is held by the memory circuit.

A semiconductor device which is an embodiment of the present invention includes: a voltage detection circuit which detects a level of electric power supplied from an external portion and outputs a potential in accordance with the level of detected electric power; a memory circuit which holds a potential in accordance with a maximum value of the potential output from the voltage detection circuit; and a protection circuit which consumes or reflects an excess of the electric power by changing impedance of a receiving portion of the electric power in accordance with the potential which is held by the memory circuit.

The memory circuit includes a reset terminal, and resets the potential which is held when a reset signal is input to the reset terminal.

A wireless tag can be provided by using an embodiment of a semiconductor device of the present invention, a wireless communication circuit by which communication with an external portion can be performed wirelessly, a power supply circuit which generates a DC voltage based on electric power supplied from the external portion, and a logic circuit which is driven by the generated DC voltage and performs data processing.

EFFECT OF THE INVENTION

An overvoltage protection circuit included in an embodiment of the present invention receives a carrier wave or an amplitude modulation wave, and in the case where a generated voltage is close to an operation start voltage of the overvoltage protection circuit, after the overvoltage protection circuit starts operating once, a maximum value of the generated voltage is held by a memory circuit, whereby the overvoltage protection circuit is controlled in accordance with the held voltage. Therefore, the voltage at which the overvoltage protection circuit starts operating and the voltage at which the overvoltage protection circuit stops operating are different from each other. Thus, hysteresis occurs between the timing when the overvoltage protection circuit starts operating and the timing when the overvoltage protection circuit stops operating.

With such a structure, the overvoltage protection circuit operates such that the overvoltage protection circuit does not react sensitively to slight amplitude of received electric power of the carrier wave or the amplitude modulation wave and is stabilized; therefore, a modulation signal or demodulation signal is hardly affected by noise. Thus, in a wireless communication system using a R/W outputting high electric power, an internal circuit of a wireless tag is favorably protected from generation of an excessive voltage, and normal wireless communication can be stably performed without the electric power being changed due to modulation of the amplitude modulation wave.

BRIEF DESCRIPTION OF DRAWINGS

FIGS. 13A to 13C are diagrams illustrating a manufacturing process of a semiconductor device according to an embodiment of the present invention.

BEST MODE FOR CARRYING OUT THE INVENTION

Figure 1:
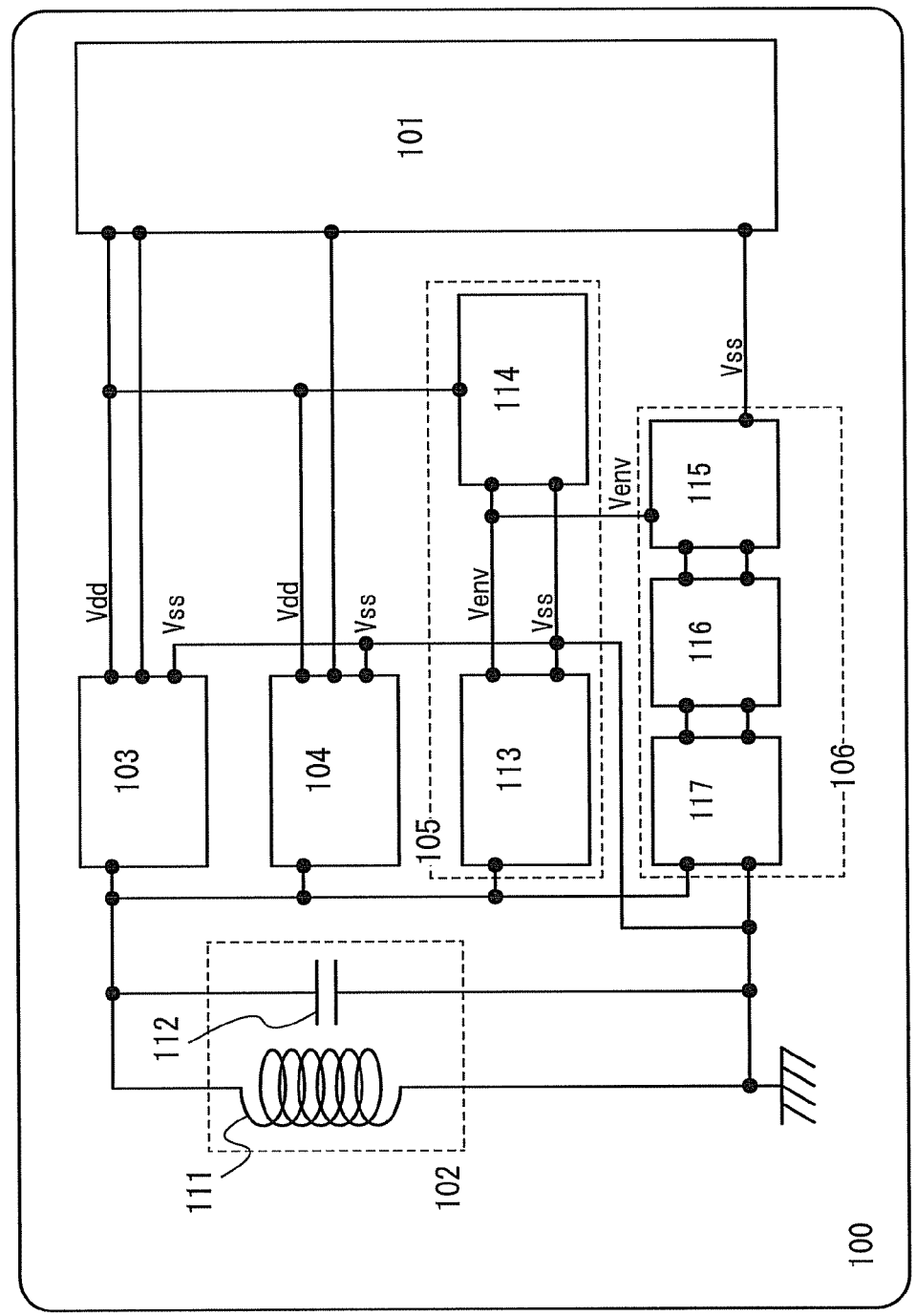
FIG. 1 shows a structure of a semiconductor device according to an embodiment of the present invention.

Hereinafter, embodiments and examples of the present invention will be described in detail with reference to the accompanying drawings. However, the present invention is not limited to the descriptions below, and it is easily understood by those skilled in the art that modes and details thereof can be modified in various ways and applied without departing from the purpose and the scope of the present invention. Therefore, the present invention should not be interpreted as being limited to what is described in the embodiments and examples described below. The same reference numerals are commonly given to the same components or components having the same function in different drawings, and repetitive explanation will be omitted.

(Embodiment 1)

Embodiment 1 of the present invention will be described with reference to FIG. 1.

FIG. 1 is a block diagram of a wireless tag according to an embodiment of the present invention, and a wireless tag 100 includes: a logic circuit 101 for performing functional processing such as generating a response signal based on received data; an antenna circuit 102 for transmitting and receiving signals to/from a R/W; a demodulation circuit 103 for demodulating an amplitude modulation wave which is received by the antenna circuit 102 and extracting a pulse signal; a modulation circuit 104 for modulating the response signal which is output from the logic circuit 101 and converting the modulated signal into a signal which is transmitted to the R/W; a power supply circuit 105 for generating a DC voltage from a carrier wave or the amplitude modulation wave which is received by the antenna circuit 102; and an overvoltage protection circuit 106 according to an embodiment of the present invention, for preventing an overvoltage from applying to internal circuits. The antennal circuit 102, the demodulation circuit 103, and the modulation circuit 104 correspond to wireless communication circuits, and by using the wireless communication circuits, wireless communication with the R/W outside the wireless tag 100 can be performed.

The antenna circuit 102 includes an antenna 111 and a resonant capacitor 112. Here, there is no particular limitation on the antenna 111 although reception power of the carrier wave from the R/W is changed depending on the shape and the number of windings of the antenna 111. The resonant capacitor 112 is provided for optimizing the resonance frequency of the antenna circuit 102 with respect to the frequency of the carrier wave from the R/W by a combination with the antenna 111.

The power supply circuit 105 includes: a rectifier circuit 113 for rectifying the carrier wave or the amplitude modulation wave received by the antenna circuit 102 and generating an envelope voltage Venv which is a DC voltage; and a constant voltage circuit 114 for adjusting the Venv so as not to greatly exceed a desired voltage and adjusting the Venv to be a constant voltage Vdd.

The overvoltage protection circuit 106 includes: a voltage detection circuit 115 for monitoring a voltage output from the power supply circuit 105 and supplied to internal circuits such as the logic circuit 101, the demodulation circuit 103, and the modulation circuit 104; a memory circuit 116 for storing the maximum value of the voltage detected by the voltage detection circuit 115; and a protection circuit 117 for operation in accordance with the voltage stored by the memory circuit 116.

Figure 2A:
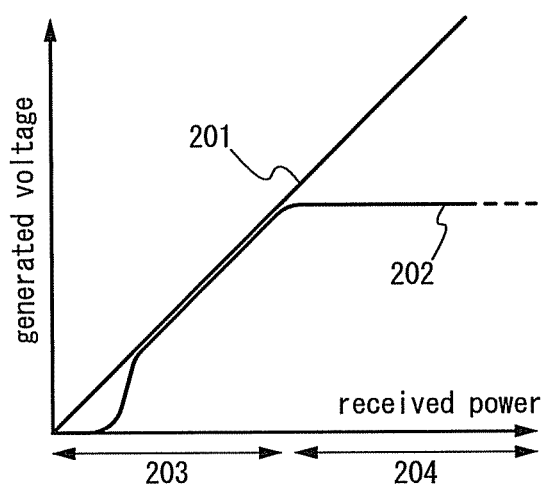
FIGS. 2A and 2B show operation of a power supply circuit and modulation of a carrier wave by superimposing a signal on the carrier wave.

Operation of each portion of the wireless tag 100 will be described with reference to FIGS. 2A and 2B. In the antenna circuit 102, when the carrier wave or the amplitude modulation wave from the R/W is received, the rectifier circuit 113 rectifies an alternate carrier wave or the amplitude modulation wave to generate a DC voltage Venv 201. Subsequently, the constant voltage circuit 114 outputs a regulate voltage Vdd 202 based on the Venv 201. As shown in FIG. 2A, when the Venv 201 is low, that is, in a region (203) whose received power is low, the constant voltage circuit 114 outputs a voltage such that Venv=Vdd is almost satisfied. However, when the Venv 201 is increased in accordance with increase of the received power in the antenna circuit 102 and reaches a certain voltage, that is, in a region (204), even if the Venv 201 is increased further, a constant regulate voltage Vdd 202 is output.

Figure 2B:
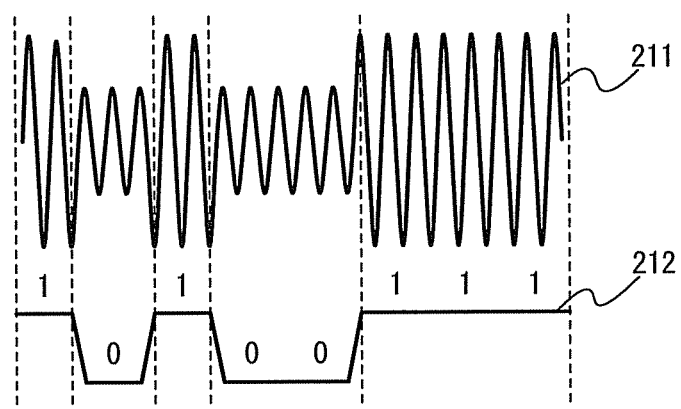

On the other hand, in the demodulation circuit 103, an amplitude modulation wave 211 is demodulated, a signal superimposed by the carrier wave is extracted, and the signal is input to the logic circuit 101 (see FIG. 2B).

As illustrated in FIG. 2B, the amplitude modulation wave 211 superimposes the signal thereon by applying modulation to the amplitude of the carrier wave. Such an amplitude modulation wave 211 is input to the demodulation circuit 103, and by using a difference between the region where modulation is applied to the amplitude and the region where modulation is not applied to the amplitude, a pulse signal 212 is extracted and input to the logic circuit 101.

In the logic circuit 101, the response signal is generated in accordance with the pulse signal 212 and input to the modulation circuit 104. In the modulation circuit 104, the carrier wave output from the R/W is modulated in accordance with the response signal, whereby the response signal is returned to the R/W.

Figure 3:
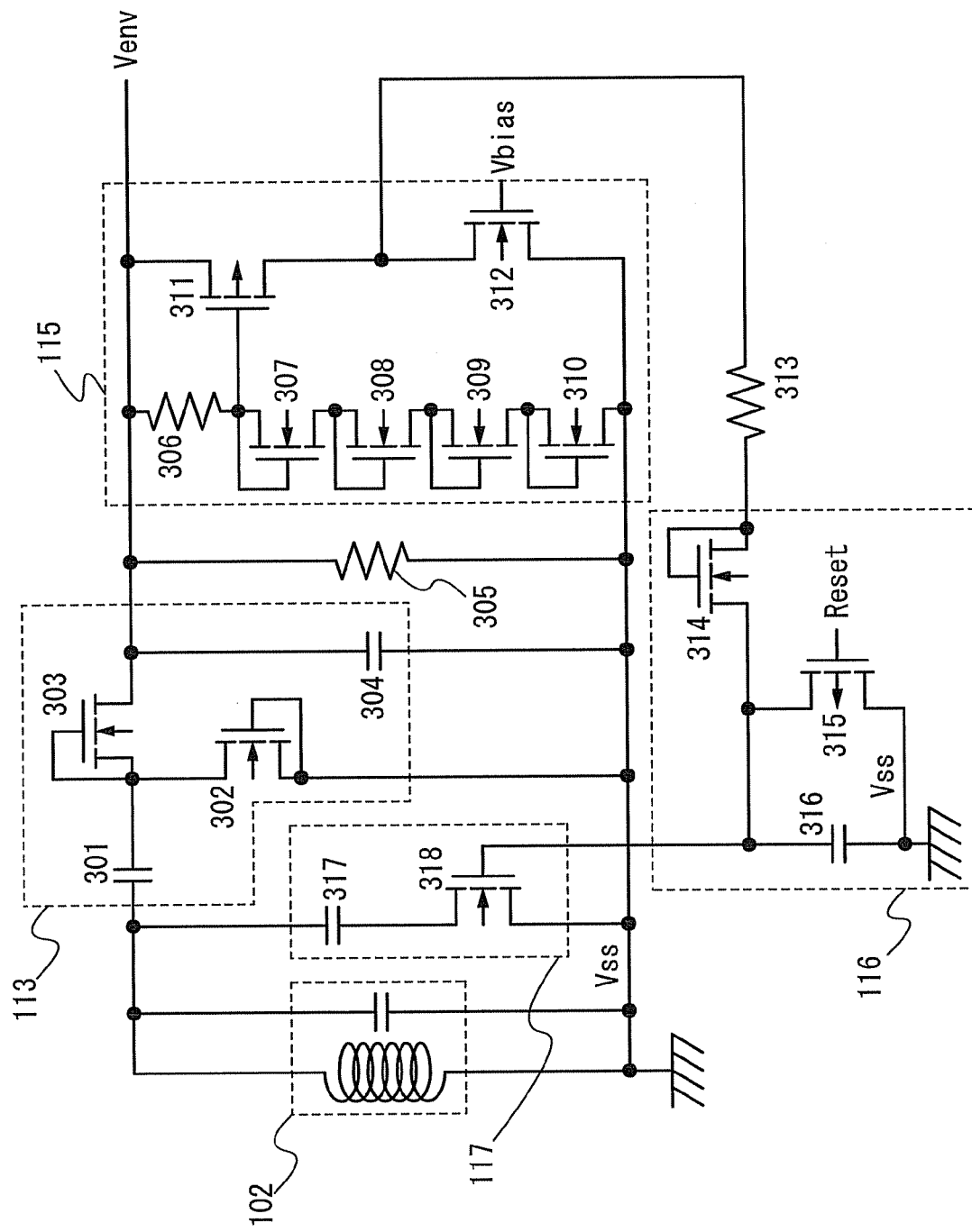
FIG. 3 shows an embodiment of an overvoltage protection circuit according to an embodiment of the present invention.

Next, a structure and operation of the overvoltage protection circuit according to an embodiment of the present invention are described. FIG. 3 shows an example of a circuit configuration of the overvoltage protection circuit 106 for carrying out the present invention.

The rectifier circuit 113 includes a capacitor 301, a transistor 302, a transistor 303, and a capacitor 304. In an example of the rectifier circuit 113 shown in FIG. 3, a half-wave voltage doubler rectifier circuit including a clamp circuit formed with the capacitor 301 and the transistor 302 is employed.

The voltage detection circuit 115 includes a resistor 306, transistors 307 to 310, a transistor 311, and a transistor 312.

The memory circuit 116 includes a transistor 314, a transistor 315, and a capacitor 316.

The protection circuit 117 includes a capacitor 317 and a transistor 318.

Hereinafter, detailed operation of the overvoltage protection circuit shown in FIG. 3 is described. Note that, as for the transistors, both an n-channel transistor and a p-channel transistor are used, and when mentioning on and off of each transistor, they are referred to as exceeding or falling below a threshold voltage. However, unless otherwise specified, the term "exceeding the threshold voltage" means that an absolute value of a gate-source voltage exceeds an absolute value of the threshold voltage, and the term "falling below the threshold voltage" means that the absolute value of the gate-source voltage falls below the absolute value of the threshold voltage. Hereinafter, in accordance with this, both an n-channel transistor and a p-channel transistor are described with a similar description.

When the antenna circuit 102 receives the carrier wave, the antenna circuit 102 is brought into a resonant state, and amplitude is applied to one electrode of the capacitor 301. A potential which is off set by the amount of a source-drain voltage of the diode-connected transistor 302 is set in the other electrode of the capacitor 301 as compared to the potential of the one electrode of the capacitor 301. The potential is half-wave rectified by the diode-connected transistor 303 and a DC voltage Venv is generated. The capacitor 304 is a smoothing capacitor, and the capacitor 304 holds the generated DC voltage Venv and smoothes noise. Here, a resistor 305 is a pull-down resistor, and output of the rectifier circuit 113 is pulled down on a Vss side when the DC voltage is not generated in the rectifier circuit 113.

The generated DC current Venv is monitored by the voltage detection circuit 115. Specifically, a potential which is divided between the resistor 306 provided between the Venv and the Vss and the transistors 307 to 310 is extracted. When the Venv is low, in each of the diode-connected transistors 307 to 310, a gate-source voltage falls below the threshold voltage, so each of the diode-connected transistors 307 to 310 is in an off state. Therefore, a gate potential of the transistor 311 is almost equal to the Venv, and the transistor 311 is turned off. When the Venv is increased, in each of the transistors 307 to 310, the gate-source voltage exceeds the threshold voltage, and each of the transistors 307 to 310 is turned on. In accordance with change in impedance between the source and the drain of each of the transistors 307 to 310, the gate potential of the transistor 311 corresponds to a potential which is divided between the transistors 307 to 310 and the resistor 306. When the Venv is further increased, a gate-source voltage exceeds the threshold voltage in the transistor 311, and the transistor 311 is turned on.

Further, a bias potential is applied to a gate of the transistor 312, and when the transistor 311 is turned on, the transistor 312 operates as a constant current source. In accordance with change in impedance between a source and a drain of the transistor 311, a drain potential of the transistor 311 is determined depending on the divided voltage between a source and a drain of the transistor 312.

An output potential from the voltage detection circuit 115 is input to the memory circuit 116 through the resistor 313. Note that the resistor 313 is provided for reducing noise of the signal input to the memory circuit 116, or the like, and even if the resistor 313 is not particularly provided, the principle of operation is not changed.

When the Venv is low, the transistor 311 is turned off, and a potential which is close to the Vss is input to the memory circuit 116. When the Venv is greatly increased as described above, the transistor 311 is turned on, and a potential which is divided between the transistor 311 and the transistor 312 is increased and input to the memory circuit 116. One electrode of the capacitor 316 is connected to the Vss side, and the other electrode holds the potential which is close to the Vss or which is divided between the transistor 311 and the transistor 312, depending on a state of the voltage detection circuit 115.

When the potential of the other electrode of the capacitor 316 is increased, a gate potential of the transistor 318 is increased in the protection circuit 117, and if a gate-source voltage exceeds the threshold voltage, the transistor 318 is turned on. At this time, since one terminal of the antenna circuit 102 is connected to the Vss side through the capacitor 317 and the transistor 318, resonance frequency is changed due to impedances of the capacitor 317 and the transistor 318.

Figure 6A:
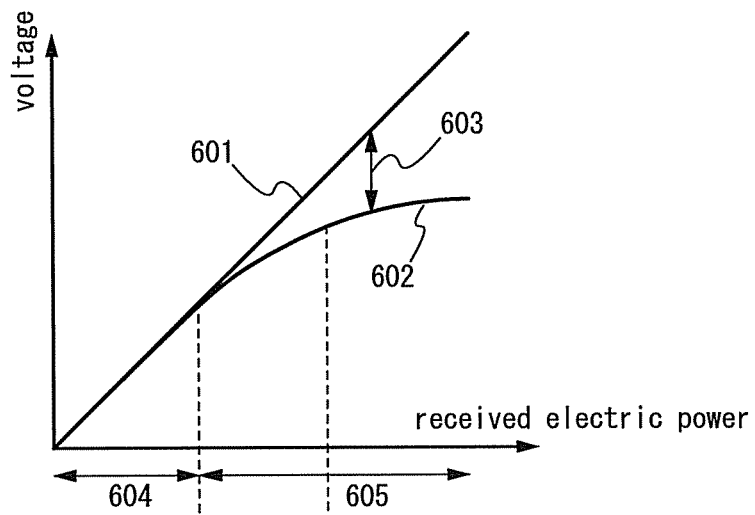
FIGS. 6A and 6B are graphs each showing operation of a voltage detection circuit included in an overvoltage protection circuit according to an embodiment of the present invention.
Figure 6B:
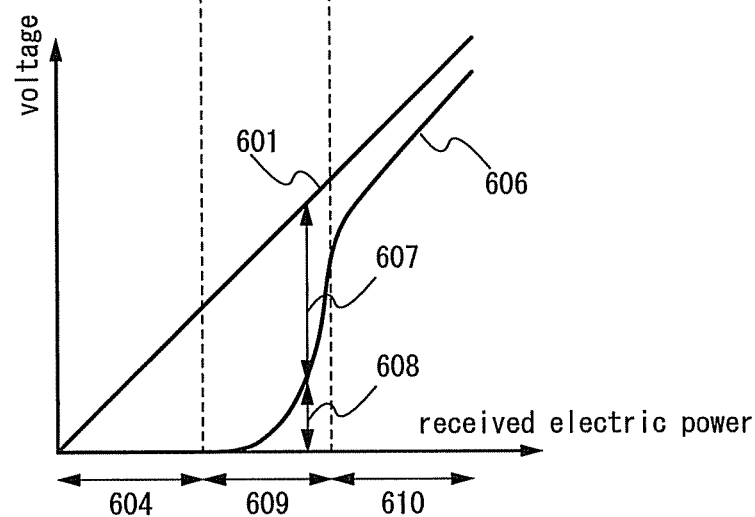

FIG. 6A schematically shows a relationship between the gate potential of the transistor 311 and change in the Venv in the voltage detection circuit 115, and FIG. 6B schematically shows a relationship between the gate potential of the transistor 318 and change in the Venv in the protection circuit 117.

In FIG. 6A, a reference numeral 601 denotes change in the Venv with respect to received power, and a reference numeral 602 denotes change in the gate potential of the transistor 311. A potential difference represented by a reference numeral 603 corresponds to the gate-source voltage of the transistor 311.

In a region 604 where input power is low, since the transistors 307 to 310 are turned off, the gate potential of the transistor 311 is almost equal to the Venv, and the transistor 311 is turned off. In a region 605 where the input power is high, the transistors 307 to 310 are turned on, and the potential difference represented by the reference numeral 603 starts to be generated. Therefore, the transistor 311 is turned on.

In FIG. 6B, a reference numeral 606 denotes change in the drain potential of the transistor 311. A potential difference represented by a reference numeral 607 corresponds to the source-drain voltage of the transistor 311.

In the region 604 where the input power is low, since the transistor 311 is turned off, the drain potential of the transistor 311 is almost equal to the Vss, and the diode-connected transistor 314 is turned off. In a region 609 where the input power has gradually increased, the transistor 311 is turned on, and the drain potential of the transistor 311 starts to be increased. In the transistor 314, when a gate-source voltage starts to be increased and exceeds the threshold voltage, the transistor 314 is turned on, and the gate potential of the transistor 318 starts to be increased. At this time, a potential difference represented by a reference numeral 608 corresponds to the gate-source voltage of the transistor 318. When the gate-source voltage of the transistor 318 exceeds the threshold voltage and the transistor 318 is turned on, impedance between the source and the drain of the transistor 318 is changed and a current easily flows. In the region 609, the transistor 318 operates in a saturation region, impedance is greatly changed in accordance with change in the gate-source voltage. Therefore, current consumption of the transistor 318 becomes high, and the resonance frequency in the antenna circuit 102 significantly changes. In a region 610 where the input power is further increased, the gate-source voltage of the transistor 318 is widened, and the transistor 318 operates in a linear region. In this region, the transistor 318 is completely turned on, and the protection circuit 117 completely functions.

Through the above operation, in the case where an overvoltage is generated, that is, in the case where the Venv is increased too much, excessive electric power is consumed by operation of the protection circuit 117, or the reflection coefficient is increased by changing the resonance frequency of the antenna and the voltage generated by the rectifier circuit 113 is reduced by intentionally generating return loss.

Here, in the memory circuit 116, once the gate potential of the transistor 318 is increased by a potential of the other electrode of the capacitor 316, that is, through the diode-connected transistor 314, a reverse current is prevented by the diode-connected transistor 314; therefore, even when the Venv is somewhat decreased and a potential output from the voltage detection circuit 115 is decreased, a potential at its peak is held.

Accordingly, the protection circuit 117 is stabilized because the transistor 318 is not repeatedly turned on and off depending on a minute increase or decrease in a potential of the Venv due to amplitude modulation of the R/W.

When the communication is completed later, a reset signal is input to a gate of the transistor 315 and the transistor 315 is turned on. Thus, a charge held by the diode-connected transistor 314 and the capacitor 316 is discharged through the transistor 315, whereby the gate potential of the transistor 318 is decreased. Accordingly, the protection circuit 117 stops operating.

Note that another structure may be employed as for control of the transistor 315. For example, in the case where the carrier wave from the R/W stops due to completion of the communication, or in the case where the wireless tag stops communicating with the R/W and the carrier wave is out of the response range, generation of a DC voltage is stopped in the power supply circuit. Therefore, the Venv is significantly decreased. When a potential of this Venv is input to the gate of the transistor 315 in spite of the reset signal, the Venv is decreased due to operation after the completion of the communication and the transistor 315 is turned on. Thus, the potential held by the capacitor 316 is reset, and the protection circuit 117 stops operating.

Through the above-described operation, in the overvoltage protection circuit according to an embodiment of the present invention, hysteresis occurs between an operation start voltage and an operation stop voltage of the overvoltage protection circuit. Thus, meaningless switching between operating and nonoperating at a voltage close to the operation start voltage can be suppressed and the overvoltage protection circuit can stably operate.

Since the overvoltage protection circuit can stably operate, an adverse effect of noise on the antenna can be minimized, which greatly contributes to improvement of stability of the communication and improvement of the maximum communication distance.

Note that a detailed structure of the circuit of the present invention is not limited to the structure shown in FIG. 3, and a different structure may be employed as appropriate depending on the polarities of the transistors and the magnitude relation of power source potentials. For example, in the voltage detection circuit 115, the transistors 307 to 310 which are used for dividing the Venv and the Vss are n-channel transistors, the transistor 311 is a p-channel transistor, and the transistor 318 which is used in the protection circuit 117 is an n-channel transistor; however, a circuit configuration having a similar function can be easily achieved even when the polarities and the connection relations of the transistors are designed opposite, so a structure in which the polarities and the connection relations of the transistors are designed opposite is naturally included in the present invention. Note that, in that case, a power supply potential or the like to which the transistor 315 is connected has to be changed; however, the function of the present invention is not changed.

(Embodiment 2)

In this embodiment, one example of a method for manufacturing the semiconductor device described in the above embodiment is described.

Figure 12A:
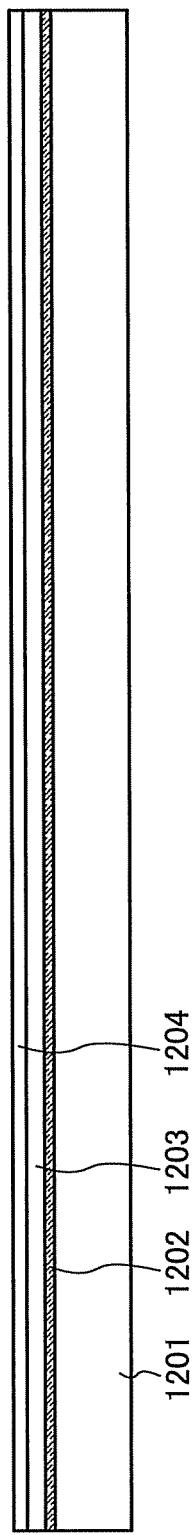
FIGS. 12A to 12C are diagrams illustrating a manufacturing process of a semiconductor device according to an embodiment of the present invention.

First, a separation layer 1202 is formed over one surface of a substrate 1201. Then, an insulating film 1203 serving as a base and a semiconductor film 1204 (for example, a film containing amorphous silicon) are formed (see FIG. 12A). The separation layer 1202, the insulating film 1203, and the semiconductor film 1204 can be formed consecutively. By forming consecutively, they are not exposed to the air so that impurities can be prevented from being contained therein.

As the substrate 1201, a glass substrate, a quartz substrate, a metal substrate, a stainless steel substrate, a plastic substrate that can withstand the treatment temperature of the process described here, or the like can be used. When such a substrate is used, area and shape thereof are not restricted so much; therefore, by using a rectangular substrate with at least one meter on a side, for example, the productivity can be drastically improved. This is a major advantage as compared to the case of using a circular silicon substrate. Therefore, even in the case of forming a large circuit portion, the cost can be low as compared to the case of using a silicon substrate.

Note that, in this process, the separation layer 1202 is provided on an entire surface of the substrate 1201; however, after providing the separation layer on the entire surface of the substrate 1201, the separation layer 1202 may be selectively provided by photolithography, if necessary. In addition, although the separation layer 1202 is formed to be in contact with the substrate 1201, an insulating film such as a silicon oxide film, a silicon oxynitride film, a silicon nitride film, or a silicon nitride oxide film may be formed to be in contact with the substrate 1201, if necessary, and then the separation layer 1202 may be formed to be in contact with the insulating film.

Note that, here, an oxynitride is a substance that contains more oxygen than nitrogen, and a nitride oxide is a substance that contains more nitrogen than oxygen. For example, silicon oxynitride is a substance containing oxygen, nitrogen, silicon, and hydrogen in ranges of from 50 to 70 at. %, from 0.5 to 15 at. %, from 25 to 35 at. %, and from 0.1 to 10 at. %, respectively. Further, silicon nitride oxide is a substance containing oxygen, nitrogen, silicon, and hydrogen in ranges of from 5 to 30 at. %, from 20 to 55 at. %, from 25 to 35 at. %, and from 10 to 30 at. %, respectively. Note that the above-described composition ranges are obtained by using Rutherford backscattering spectrometry (RBS) or hydrogen forward scattering (HFS). Moreover, the total for the content ratio of the constituent elements is taken to be a value that does not exceed 100 at. %.

As the separation layer 1202, a metal film, a stacked-layer structure of a metal film and a metal oxide film, or the like can be used. The metal film is formed to have a single-layer structure or a stacked-layer structure of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material which contains any of these elements as a main component. In addition, the metal film can be formed by a sputtering method, various CVD methods such as a plasma CVD method or the like. As the stacked-layer structure of a metal film and a metal oxide film, after the above-described metal film is formed, an oxide or oxynitride of the metal film can be formed on a surface of the metal film by performing plasma treatment in an oxygen atmosphere or an $N_2O$ atmosphere, or heat treatment in an oxygen atmosphere or an $N_2O$ atmosphere. Alternatively, the surface of the metal film may be processed with a strong oxidative solution such as ozone water after the above-described metal film is formed, whereby an oxide or an oxynitride of the metal film can be provided on the surface of the metal film.

The insulating film 1203 is formed to have a single-layer structure or a stacked-layer structure of a film containing an oxide of silicon or a nitride of silicon by a sputtering method, a plasma CVD method, or the like. In the case where the insulating film serving as a base employs a two-layer structure, a silicon nitride oxide film may be formed as a first insulating film, and a silicon oxynitride film may be formed as a second insulating film, for example. If the insulating film serving as a base employs a three-layer structure, a silicon oxide film, a silicon nitride oxide film, and a silicon oxynitride film may be formed as a first insulating film, a second insulating film, and a third insulating film, respectively. Alternatively, a silicon oxynitride film, a silicon nitride oxide film, and a silicon oxynitride film may be formed as a first insulating film, a second insulating film, and a third insulating film, respectively. The insulating film 1203 serving as a base functions as a blocking film for preventing impurities from entering from the substrate 1201.

The semiconductor film 1204 is formed with a thickness of 25 nm to 200 nm, preferably, 50 nm to 70 nm, specifically, 66 nm by a sputtering method, an LPCVD method, a plasma CVD method, or the like. An amorphous silicon film may be formed for the semiconductor film 1204, for example.

Figure 12B:
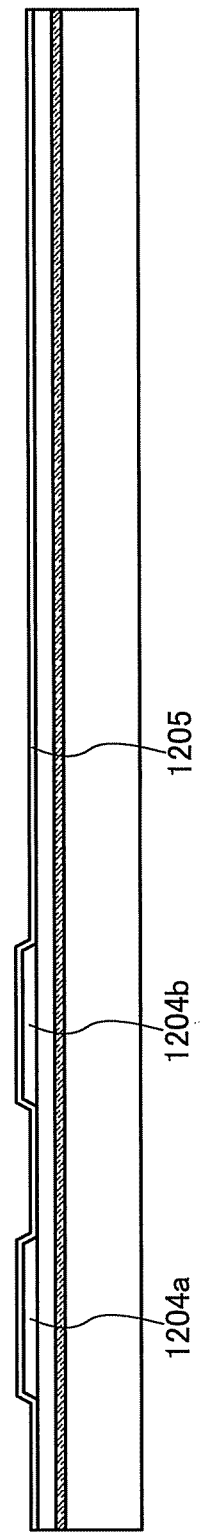

Next, the semiconductor film 1204 is irradiated with laser light to be crystallized. Note that the semiconductor film 1204 may be crystallized by a method in which laser light irradiation is combined with thermal crystallization using RTA or an annealing furnace or thermal crystallization using a metal element which promotes crystallization. After that, the obtained crystalline semiconductor film is etched into a desired shape, whereby semiconductor films 1204*a* and 1204*b* are formed. Then, a gate insulating film 1205 is formed so as to cover the semiconductor films 1204*a* and 1204*b* (see FIG. 12B).

An example of a formation step of the semiconductor films 1204*a* and 1204*b* is briefly described. First, an amorphous semiconductor film (e.g., an amorphous silicon film) is formed by a plasma CVD method. Next, a solution containing nickel that is a metal element for promoting crystallization is retained on the amorphous semiconductor film, and dehydrogenation treatment (at 500° C., for one hour) and thermal crystallization treatment (at 550° C., for four hours) are performed on the amorphous semiconductor film to form a crystalline semiconductor film. After that, the crystalline semiconductor film is irradiated with laser light in accordance with the level of crystallization, as needed, and by using a photolithography method, the semiconductor films 1204*a* and 1204*b* are formed. Note that the amorphous semiconductor film may be crystallized only by laser light irradiation, without thermal crystallization using a metal element for promoting crystallization.

Furthermore, the semiconductor films 1204*a* and 1204*b* can be formed by crystallizing the semiconductor film by irradiation with continuous wave laser light or laser light having a repetition rate of 10 MHz or more while scanning the laser light in one direction. The crystallization as described above has a characteristic in that the crystal grows in the scanning direction of the laser light. Transistors may be each arranged so that its channel length direction (direction in which carriers move when a channel formation region is formed) is aligned with the scanning direction.

Next, the gate insulating film 1205 covering the semiconductor films 1204*a* and 1204*b* is formed. The gate insulating film 1205 is formed to have a single-layer structure or a stacked-layer structure of a film containing an oxide of silicon or a nitride of silicon by a CVD method, a sputtering method, or the like. Specifically, the gate insulating film 1205 is formed to have a single-layer structure or a stacked-layer structure including any of a silicon oxide film, a silicon oxynitride film, and a silicon nitride oxide film.

Alternatively, the gate insulating film 1205 may be formed by performing plasma treatment on the semiconductor films 1204*a* and 1204*b* to oxidize or nitride the surfaces thereof. For example, the gate insulating film 1205 is formed by plasma treatment with a mixed gas of a rare gas such as He, Ar, Kr, and Xe, and oxygen, nitrogen oxide ($NO_2$), ammonia, nitrogen, hydrogen, and the like. When excitation of the plasma in this case is performed by using microwaves, plasma with a low electron temperature and a high density can be generated. With oxygen radical (which may include OH radical) or nitrogen radical (which may include NH radical) generated by high-density plasma, oxidizing or nitriding of the surfaces of the semiconductor films can be conducted.

By such high-density plasma treatment, an insulating film with a thickness of 1 nm to 20 nm, typically 5 nm to 10 nm, is formed on the semiconductor films. Since the reaction in this case is a solid-phase reaction, interface state density between the insulating film and the semiconductor films can be quite low. Since such high-density plasma treatment oxidizes (or nitrides) the semiconductor films (crystalline silicon, or polycrystalline silicon) directly, unevenness of a thickness of the insulating film to be formed can be extremely small. In addition, oxidation does not proceed even in a crystal grain boundary of crystalline silicon, which makes a very preferable condition. In other words, by solid-phase oxidization of surfaces of the semiconductor films by high-density plasma treatment shown here, an insulating film with favorable uniformity and low interface state density can be formed without conducting oxidation reaction extraordinarily in a crystal grain boundary.

As the gate insulating film 1205, only the insulating film formed by plasma treatment may be used, or a stacked-layer film of the insulating film formed by plasma treatment and an insulating film of silicon oxide, silicon oxynitride, silicon nitride, or the like stacked by a CVD method using plasma or thermal reaction may be used. In either case, a transistor which is formed to have a gate insulating film, which partly or entirely includes an insulating film formed by plasma treatment, is preferable because variations in characteristics can be reduced.

Further, when the semiconductor films 1204*a* and 1204*b* are formed by crystallizing the semiconductor film by irradiation with laser light having a repetition rate of 10 MHz or more while scanning the laser light in one direction, by using the gate insulating film on which the plasma treatment is performed, a thin film transistor (TFT) with less characteristic variation and high field effect mobility can be obtained.

Next, a conductive film is formed over the gate insulating film 1205. Here, the conductive film is formed to have a single-layer structure with a thickness of about 100 nm to 500 nm. The conductive film can be formed using a material containing an element selected from tantalum (Ta), tungsten (W), titanium (Ti), molybdenum (Mo), aluminum (Al), copper (Cu), chromium (Cr), niobium (Nb), and the like; an alloy material mainly containing any of these elements as a main component; or a compound material containing any of these elements as a main component. Alternatively, the conductive film may be formed using a semiconductor material typified by polycrystalline silicon doped with an impurity element such as phosphorus. In the case where the conductive film is formed to have a stacked-layer structure, for example, a stacked-layer structure of a tantalum nitride film and a tungsten film, a stacked-layer of a tungsten nitride film and a tungsten film, or a stacked-layer structure of a molybdenum nitride film and a molybdenum film can be used. For example, a stacked-layer structure of a tantalum nitride film with a thickness of 30 nm and a tungsten film with a thickness of 150 nm can be employed. Since tungsten and tantalum nitride have high thermal resistance, heat treatment for thermal activation can be performed after the conductive film is formed. Alternatively, the conductive film may be formed to have a stacked-layer structure of three or more layers, and, for example, a stacked-layer structure of a molybdenum film, an aluminum film, and a molybdenum film can be employed.

Next, over the conductive film, a resist mask is formed by a photolithography method, and etching treatment for forming gate electrodes and gate wirings is performed, whereby gate electrodes 1207 are formed above the semiconductor films 1204*a* and 1204*b*.

Next, a resist mask is formed by a photolithography method, and an impurity element imparting n-type or p-type conductivity is added to the semiconductor films 1204*a* and 1204*b* at low concentration by an ion doping method or an ion implantation method. In this embodiment, an impurity element imparting n-type conductivity is added to the semiconductor films 1204*a* and 1204*b* at low concentration. As the impurity element imparting n-type conductivity, an element belonging to Group 15 may be used; for example, phosphorus (P) or arsenic (As) can be used. As the impurity element imparting p-type conductivity, an element belonging to Group 13 may be used; for example, boron (13) can be used.

Note that, in this embodiment, the case of using only an n-type TFT is described for the sake of simplicity; however, the present invention is not interpreted as being limited thereto. A structure in which only a p-type TFT is used may be employed. Alternatively, an n-type TFT and a p-type TFT may be combined to be formed. In the case where an n-type TFT and a p-type TFT are combined to be formed, a mask covering a semiconductor layer which is to be a p-type TFT is formed and an impurity element imparting n-type conductivity is added to the semiconductor layer, and a mask covering a semiconductor layer which is to be an n-type TFT is formed and an impurity element imparting p-type conductivity is added to the semiconductor layer, whereby an impurity element imparting n-type conductivity and an impurity element imparting p-type conductivity can be selectively added.

Next, an insulating film is formed to cover the gate insulating film 1205 and the gate electrodes 1207. The insulating film is formed to have a single-layer structure or a stacked-layer structure by depositing a film containing an inorganic material such as silicon, an oxide of silicon, or a nitride of silicon, or a film containing an organic material such as an organic resin by a plasma CVD method, a sputtering method, or the like. Then, the insulating film is selectively etched by anisotropic etching in which etching is conducted mainly in a perpendicular direction, so that an insulating film (also referred to as sidewalls) 1208 that is in contact with side surfaces of the gate electrodes 1207 is formed. The insulating film 1208 is used as a mask for adding an impurity element in forming an LDD (lightly doped drain) region later.

Figure 12C:
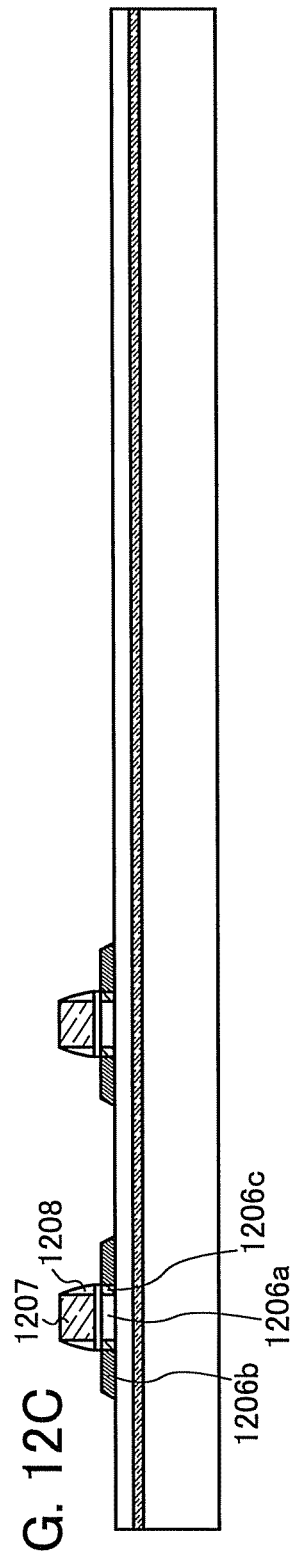

Next, an impurity element imparting n-type conductivity is added to the semiconductor films 1204a and 1204b using the resist mask formed by a photolithography method and the gate electrodes 1207 and the insulating film 1208 as masks. Accordingly, channel formation regions 1206a, first impurity regions 1206b, and second impurity regions 1206c are formed (see FIG. 12C). The first impurity regions 1206b function as source and drain regions of the thin film transistor, and the second impurity regions 1206c function as LDD regions. The concentration of the impurity element in each of the second impurity regions 1206c is lower than that in each of the first impurity regions 1206b.

Subsequently, an insulating film is formed to have a single-layer structure or a stacked-layer structure so as to cover the gate electrodes 1207, the insulating film 1208, and the like. In this embodiment, the case where a three-layer structure of an insulating film 1209, an insulating film 1210, and an insulating film 1211 is employed is described as one example. These insulating films can be formed by a CVD method, and a silicon oxynitride film having a thickness of 50 nm, a silicon nitride oxide film having a thickness of 200 nm, and a silicon oxynitride film having a thickness of 400 nm can be formed as the insulating film 1209, the insulating film 1210, and the insulating film 1211, respectively. Surfaces of these insulating films are, although depending on the thicknesses thereof, formed along the surface of the layer provided therebelow. That is, since the thickness of the insulating film 1209 is small, the surface of the insulating film 1209 closely corresponds to the surfaces of the gate electrodes 1207. As the thickness of the film is larger, its surface becomes planar; therefore, the surface of the insulating film 1211 whose thickness is the largest of the three films is almost planar. However, the insulating film 1211 is not formed using an organic material; therefore, the surface of the insulating film is different from a planar surface. That is, if it is desired that the surface of the insulating film 1211 be planar, an organic material such as polyimide, polyamide, benzocyclobutene, acrylic, or epoxy; a siloxane material; or the like may be used. Further, as a formation method of these insulating films, a sputtering method, an SOG method, a droplet discharge method, a screen printing method, or the like can be employed in addition to a CVD method.

Then, the insulating film 1209, the insulating film 1210, the insulating film 1211, and the like are etched using a photolithography method to form contact holes reaching the first impurity regions 1206b. Then, conductive films 1231a functioning as source and drain electrodes of the thin film transistors and a conductive film 1231b functioning as a connecting wiring are formed. The conductive films 1231a and the conductive film 1231b can be formed in such a manner: a conductive film is formed so as to fill the contact holes, and the conductive film is selectively etched. Note that, before the conductive film is formed, a silicide may be formed over the surfaces of the semiconductor films 1204a and 1204b that are exposed by the contact holes to reduce resistance. The conductive films 1231a and the conductive film 1231b are preferably formed using a low resistance material not to cause signal delay. Since a low resistance material often has low heat resistance, a high heat resistance material is preferably provided over and below the low resistance material. For example, a structure is preferable in which a film of aluminum, which is a low resistance material, is formed with a thickness of 300 nm and a film of titanium with a thickness of 100 nm is formed over and below the aluminum film. Further, when the conductive film 1231b, which functions as a connecting wiring, is formed to have the same stacked-layer structure as the conductive films 1231a, resistance of the connecting wiring can be lowered and heat resistance of the connecting wiring can be improved. The conductive films 1231a and the conductive film 1231b can be formed to have a single-layer structure or a stacked-layer structure using another conductive material, for example: a material containing an element selected from tungsten (W), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material containing any of these elements as its main component; or a compound material containing any of these elements as its main component. An alloy material containing aluminum as its main component corresponds to, for example, a material which contains aluminum as its main component and which also contains nickel, or an alloy material which contains aluminum as its main component and which also contains nickel and one or both of carbon and silicon. The conductive films 1231a and the conductive film 1231b can be formed by a CVD method, a sputtering method, or the like.

Accordingly, an element layer 1249 including a thin film transistor 1230a and a thin film transistor 1230b can be obtained (see FIG. 13A).

Note that heat treatment for repairing crystallinity of the semiconductor film 1204, activating the impurity element which is added to the semiconductor film 1204, and hydrogenating the semiconductor film 1204 may be performed before the insulating films 1209, 1210, and 1211 are formed; after the insulating film 1209 is formed; or after the insulating films 1209 and 1210 are formed. For the heat treatment, a thermal annealing method, a laser annealing method, an RTA method, or the like may be employed.

Next, insulating films 1212 and 1213 are formed so as to cover the conductive films 1231a and the conductive film 1231b (see FIG. 13B). The case where a silicon nitride film having a thickness of 100 nm is used for the insulating film 1212 and a polyimide film having a thickness of 1500 nm is used for the insulating film 1213 is described as an example. It is preferable that a surface of the insulating film 1213 have high planarity. Therefore, the planarity of the insulating film 1213 is improved by employing a structure in which the film has a large thickness of, for example, greater than or equal to 750 nm and less than or equal to 3000 nm (specifically, 1500 nm) in addition to the characteristics of polyimide, which is an organic material. An opening portion is formed in the insulating films 1212 and 1213. In this embodiment, the case where an opening portion 1214 exposing the conductive film 1231b is formed is described as an example. In such an opening portion 1214 (specifically, in a region 1215 surrounded by a dotted line), an end portion of the insulating film 1212 is covered with the insulating film 1213. By covering the end portion of the lower insulating film 1212 with the upper insulating film 1213, disconnection of a wiring to be formed later in the opening portion 1214 can be prevented. In this embodiment, since the insulating film 1213 is formed using polyimide, which is an organic material, the insulating film 1213 can have a gently tapered shape in the opening portion 1214, and disconnection can be efficiently prevented. As a material for the insulating film 1213 with which such an effect of preventing disconnection can be obtained, which is used for the insulating film 1213, an organic material such as polyamide, benzocyclobutene, acrylic, or epoxy; a siloxane material; or the like can be given in addition to polyimide. Further, as the insulating film 1212, a silicon oxynitride film or a silicon nitride oxide film may be used instead of the silicon nitride film. As a formation method of the insulating films 1212 and 1213, a CVD method, a sputtering method, an SOG method, a droplet discharge method, a screen printing method, or the like can be used.

Next, a conductive film 1217 is formed over the insulating film 1213, and an insulating film 1218 is formed over the conductive film 1217 (see FIG. 13C). The conductive film 1217 can be formed using the same material as the conductive films 1231a and the conductive film 1231b, and for example, a stacked-layer structure of a titanium film having a thickness of 100 nm, an aluminum film having a thickness of 200 nm, and a titanium film having a thickness of 100 nm can be employed. Since the conductive film 1217 is connected to the conductive film 1231b in the opening portion 1214, the films formed using titanium are in contact with each other, whereby contact resistance can be suppressed. In addition, since a current based on a signal between the thin film transistor and an antenna (formed later) flows in the conductive film 1217, wiring resistance of the conductive film 1217 is preferably low. Therefore, a low resistance material such as aluminum is preferably used. The conductive film 1217 can be formed to have a single-layer structure or a stacked-layer structure, using another conductive material, for example: a material containing an element selected from tungsten (W), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material containing any of these elements as its main component; or a compound material containing any of these elements as its main component. An alloy material containing aluminum as its main component corresponds to, for example, a material which contains aluminum as its main component and which also contains nickel, or an alloy material which contains aluminum as its main component and which also contains nickel and one or both of carbon and silicon. The conductive film 1217 can be formed by a CVD method, a sputtering method, or the like. Since a surface of the insulating film 1218 should have planarity, an organic material is preferably used for formation of the insulating film 1218, and the case where a polyimide film having a thickness of 2000 nm is used for the insulating film 1218 is described as an example. The insulating film 1218 is formed to have a thickness of 2000 nm, which is larger than the thickness of the insulating film 1213, because projections and depressions formed by the surfaces of the opening portion 1214 of the insulating film 1213 having a thickness of 1500 nm and the conductive film 1217 formed in the opening portion 1214 should be planarized. Therefore, the insulating film 1218 preferably has a thickness 1.1 to 2 times, preferably, 1.2 to 1.5 times as large as the thickness of the insulating film 1213, and when the insulating film 1213 has a thickness of greater than or equal to 750 nm and less than or equal to 3000 nm, the insulating film 1218 preferably has a thickness of greater than or equal to 900 nm and less than or equal to 4500 nm. The insulating film 1218 is preferably formed using a material with which planarity can be improved in consideration of the thickness of the insulating film 1218. As a material for the insulating film 1218 with which the planarity can be improved, an organic material such as polyamide, benzocyclobutene, acrylic, or epoxy; a siloxane material; or the like can be given in addition to polyimide. In the case where an antenna is formed over the insulating film 1218, as described above, the planarity of the surface of the insulating film 1218 should be taken into consideration.

Further, the insulating film 1218 preferably covers end portions of the insulating film 1213 outside the antenna (not illustrated) in the circuit portion. When the insulating film 1218 covers the insulating film 1213, it is preferable to provide a margin of two or more times as large as the total thickness of the insulating film 1213 and the insulating film 1218 between the end of the insulating film 1213 and the end of the insulating film 1218. In this embodiment, since the insulating film 1213 is formed to have a thickness of 1500 nm and the insulating film 1218 is formed to have a thickness of 2000 nm, the end of the insulating film 1218, which covers the end portion of the insulating film 1213, is away by a distance d=7000 nm from the end of the insulating film 1213. With such a structure, a margin of a process can be ensured, and further, it is expected that intrusion of water or oxygen can be prevented.

Figure 14:
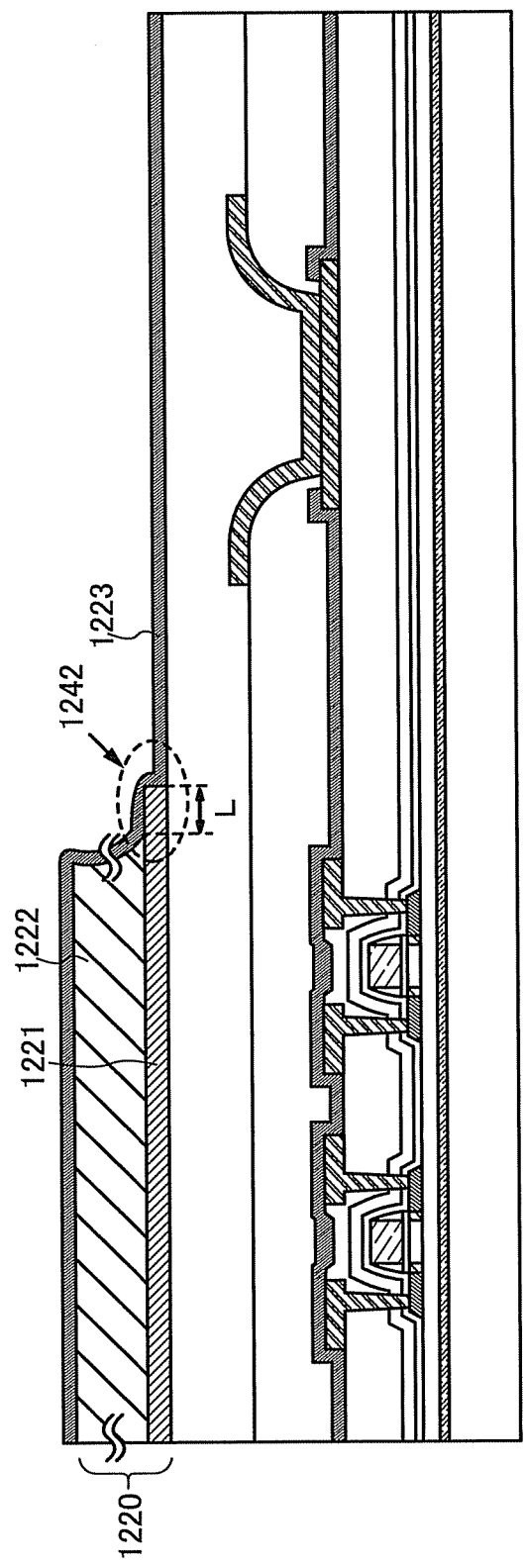
FIG. 14 is a diagram illustrating a manufacturing process of a semiconductor device according to an embodiment of the present invention.

Next, an antenna 1220 is formed over the insulating film 1218 (see FIG. 14). Then, the antenna 1220 and the conductive film 1217 are made to be electrically connected to each other through an opening portion. The opening portion is provided below the antenna 1220, and integration is performed. Note that although the antenna 1220 may be directly connected to the conductive films 1231a, provision of the conductive film 1217 as in this embodiment is preferable because a margin can be secured for formation of the opening portion for connection with the antenna 1220, and high integration can be achieved. Therefore, a conductive film may be further provided over the conductive film 1217 to be connected to the antenna 1220. That is, the antenna 1220 may be electrically connected to the conductive films 1231a included in the thin film transistors, and high integration can be achieved with a connection structure through a plurality of conductive films. When the thicknesses of the plurality of conductive films such as the conductive film 1217 are large, a semiconductor device is also thickened; therefore, the thicknesses of the plurality of conductive films are preferably small. Therefore, the thickness of the conductive film 1217 or the like is preferably smaller than that of the conductive films 1231a.

The antenna 1220 can employ a stacked-layer structure of a first conductive film 1221 and a second conductive film 1222, and the case of a stacked-layer structure of a titanium film having a thickness of 100 nm and an aluminum film having a thickness of 5000 nm is described as an example in this embodiment. Titanium can increase moisture resistance of the antenna, and can increase adhesion between the insulating film 1218 and the antenna 1220. In addition, titanium can decrease contact resistance with the conductive film 1217. This is because, since the titanium film is formed as the uppermost layer of the conductive film 1217, the titanium film and the titanium film in the antenna, which are formed from the same material, are in contact with each other. The titanium film is formed by dry etching, so an end portion thereof tends to have a steep angle. Aluminum is a low resistance material, so it is suitable for the antenna. By forming the aluminum film thickly, resistance can be further lowered. Resistance of the antenna is preferably lowered because a communication distance can be increased. Such an aluminum film is formed by wet etching, so a side surface of the end portion tends to have a tapered shape. The tapered shape in this embodiment is a shape whose side surface curves toward the inside of the aluminum film, that is, a shape having a curved recessed side surface. Further, when the aluminum film is etched by wet etching, an end portion of the aluminum film is inside the end portion of the titanium film (a region 1242). For example, it is preferable that the end portion of the aluminum film be inside the titanium film and the distance between the ends of the aluminum film and the titanium film be a distance (a distance L) one-sixth to one-half the thickness of the aluminum film. In this embodiment, the end portion of the aluminum film may be provided inside the end portion of the titanium film by the distance L=0.8 μm to 2 μm. Since the end portion of the titanium film is projected from the end portion of the aluminum film, disconnection of an insulating film which is formed later can be prevented, and further, the durability of the antenna can be increased.

The antenna can be formed using, as a conductive material, a material containing a metal element such as silver, copper, gold, platinum, nickel, palladium, tantalum, or molybdenum, an alloy material containing any of the metal elements, or a compound material containing any of the metal elements in addition to aluminum and titanium. As the formation method of the antenna, a CVD method, a sputtering method, a printing method such as screen printing or gravure printing, a droplet discharge method, a dispenser method, a plating method, or the like can be given. Although a stacked-layer structure is described as an example in this embodiment, a single-layer structure of any of the above-described material may be employed.

An insulating film 1223 is formed so as to cover the antenna 1220. In this embodiment, the insulating film 1223 is formed using a silicon nitride film having a thickness of 200 μm. The insulating film 1223 is preferably provided because moisture resistance of the antenna can be further increased. Since the end portion of the titanium film is projected from the end portion of the aluminum film, the insulating film 1223 can be formed without disconnection. The insulating film 1223 as described above can be formed using a silicon oxynitride film, a silicon nitride oxide film, or another inorganic material in addition to the silicon nitride film.

In such a manner, a semiconductor integrated circuit formed using an insulating substrate can be completed.

This embodiment can be implemented in combination with any of the other embodiments as appropriate.

(Embodiment 3)

In this embodiment, a method for manufacturing a semiconductor device with higher reliability and high yield is described with reference to FIGS. 9A to 9D. In this embodiment, a CMOS (complementary metal oxide semiconductor) is described as an example of the semiconductor device.

Figure 9A:
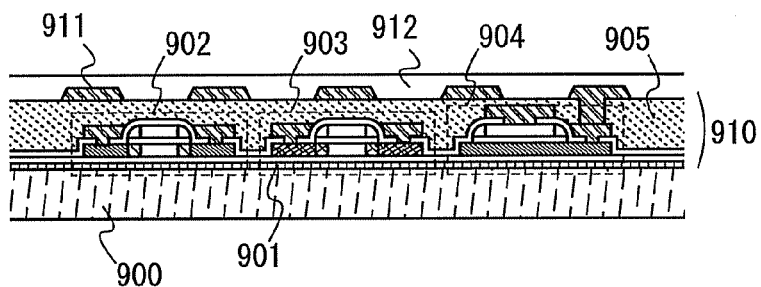
FIGS. 9A to 9D are diagrams illustrating a manufacturing process of a semiconductor device according to an embodiment of the present invention.
Figure 9B:
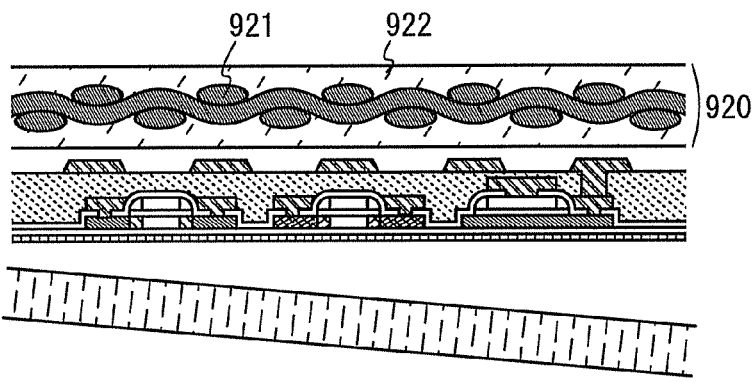

Transistors 902 and 903, a capacitor 904, and an insulating layer 905 are provided over a formation substrate 900 with a separation layer 901 interposed therebetween, and a semiconductor integrated circuit 910 is formed (see FIG. 9A).

The transistors 902 and 903 are thin film transistors, and each include source and drain regions, a low-concentration impurity region, a channel formation region, a gate insulating layer, a gate electrode, and a source electrode or a drain electrode. The source and drain regions are in contact with wirings serving as source and drain electrodes, respectively, and electrically connected thereto.

The transistor 902 is an n-channel transistor, and includes an impurity element imparting n-type conductivity (e.g., phosphorus (P) or arsenic (As)) in the source and drain regions and the low-concentration impurity region. The transistor 903 is a p-channel transistor, and includes an impurity element imparting p-type conductivity (e.g., boron (B), aluminum (Al), or gallium (Ga)) in the source and drain regions and the low-concentration impurity region.

The capacitor 904 is formed through a similar step to that of the transistors 902 and 903, and one electrode is formed using a semiconductor layer and the other electrode is formed using a gate electrode. At this time, for efficiently ensuring a capacitance value, an impurity element may be added to the semiconductor layer for forming the capacitor 904 before the gate electrode layer is formed. Through this step, the impurity element is also added to the semiconductor layer provided in a region which is a lower layer of the gate electrode layer. Therefore, the capacitor efficiently functions.

Next, an antenna 911 formed using a conductive film is formed over the insulating layer 905, and a protective film 912 is formed over the antenna 911. The antenna 911 is electrically connected to the semiconductor integrated circuit. In FIG. 9A, the antenna 911 is electrically connected to one electrode of the capacitor 904.

Subsequently, an insulator 920 is formed over the protective film 912. As the insulator 920, for example, a structure body may be used in which fibrous bodies 921 are impregnated with an organic resin 922.

After the protective film 912 and the insulator 920 are bonded to each other, the semiconductor integrated circuit 910, the antenna 911, and the protective film 912 are separated from the substrate 900 using the separation layer 901 as an interface. Thus, the semiconductor integrated circuit 910, the antenna 911, and the protective film 912 are provided on the insulator 920 side (see FIG. 9B).

The protective film 912 and the insulator 920 may be bonded to each other using an adhesive which is not particularly illustrated or may be bonded by compression bonding or thermocompression bonding.

Figure 9C:
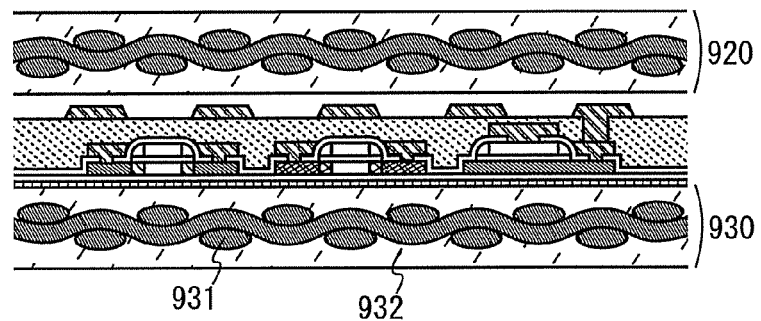
Figure 9D:
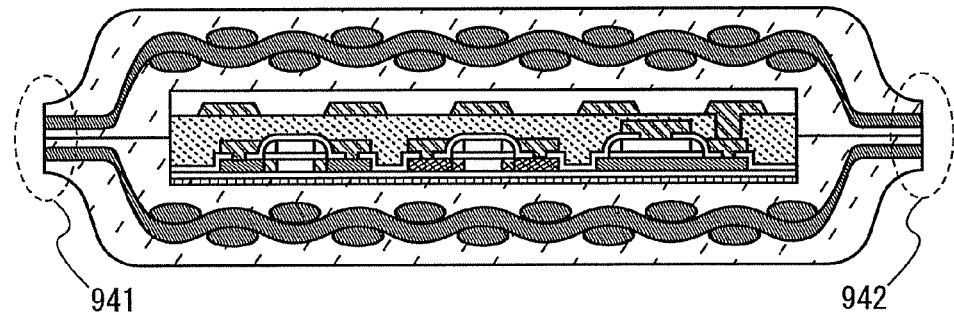

After that, an exposed separation surface of the semiconductor integrated circuit 910 is bonded to the insulator 930 with the separation layer 901 interposed therebetween, whereby the semiconductor integrated circuit 910, the antenna 911, and the protective film 912 are interposed between the insulator 920 and the insulator 930 (see FIG. 9C).

As the insulator 930, in a similar manner to the insulator 920, a structure body may be used in which fibrous bodies 931 are impregnated with an organic resin 932.

Although not particularly illustrated, a large number of structural bodies in which pluralities of semiconductor integrated circuits 910, antennas 911, and protective films 912 are formed are interposed between the insulators 920 and 930 so that they are arranged in a plane direction; and the structural bodies are divided into individual pieces to manufacture semiconductor integrated circuit chips in each of which the semiconductor integrated circuit 910, the antenna 911, and the protective film 912 are interposed between the insulators 920 and 930. There is no particular limitation on a separation means as long as the means enables physical separation, and separation is performed along a separation line by laser light irradiation in this embodiment as a preferable example.

By laser light irradiation to perform separation, the insulators 920 and 930 are melted on divided surfaces 941 and 942 of the semiconductor integrated circuit chips. With the insulators 920 and 930 melted, each semiconductor integrated circuit chip has a structure in which the semiconductor integrated circuit 910, the antenna 911, and the protective film 912 are entirely sealed with the insulators 920 and 930.

Although not particularly illustrated here, an insulator may be further provided outside or inside the insulators 920 and 930 in order to cover the whole surfaces of the semiconductor integrated circuit 910, the antenna 911, and the protective film 912 more favorably.

By the above-described formation, the semiconductor integrated circuit is interposed between the insulators. Therefore, in a manufacturing process, an adverse effect such as breakdown or a characteristic defect on the semiconductor integrated circuit due to external stress or stress can be prevented. Thus, a semiconductor device with high reliability can be manufactured with high yield.

Note that the semiconductor device manufactured in this embodiment can have flexibility with the use of a flexible insulator.

Semiconductor layers included in the transistors 902 and 903 and the capacitor 904 can be formed using any of the following materials: an amorphous semiconductor (hereinafter also referred to as "AS") manufactured by a vapor-phase growth method using a semiconductor material gas typified by silane or germane or a sputtering method; a polycrystalline semiconductor formed by crystallizing the amorphous semiconductor with the use of light energy or thermal energy; a microcrystalline (also referred to as semiamorphous or microcrystal) semiconductor (hereinafter also referred to as "SAS"); or the like. The semiconductor layer can be formed by a sputtering method, an LPCVD method, a plasma CVD method, or the like.

The microcrystalline semiconductor film belongs to a metastable state which is intermediate between an amorphous state and a single crystal state when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, shifts to the lower wavenumber side than 520 cm$^{-1}$ which represents single crystal silicon. That is, the peak of the Raman spectrum of the microcrystalline silicon exists between 520 cm$^{-1}$ which represents single crystal silicon and 480 cm$^{-1}$ which represents amorphous silicon. The semiconductor includes hydrogen or halogen of at least 1 at. % to terminate a dangling bond. Moreover, a rare gas element such as helium, argon, krypton, or neon may be included to further promote lattice distortion, so that stability is enhanced and a favorable microcrystalline semiconductor film can be obtained.

The microcrystalline semiconductor film can be formed by a high-frequency plasma CVD method with a frequency of several tens to several hundreds of megahertz or a microwave plasma CVD apparatus with a frequency of 1 GHz or more. The microcrystalline semiconductor film can be typically formed using a dilution of silicon hydride such as $SiH_4$, $Si_2H_6$, $SiH_2Cl_2$, $SiHCl_3$, $SiCl_4$, or $SiF_4$ with hydrogen. With a dilution with one or plural kinds of rare gas elements selected from helium, argon, krypton, and neon in addition to silicon hydride and hydrogen, the microcrystalline semiconductor film can be formed. In that case, the flow rate ratio of hydrogen to silicon hydride is set to be 5:1 to 200:1, preferably, 50:1 to 150:1, more preferably, 100:1.

As an example of a typical amorphous semiconductor, hydrogenated amorphous silicon can be given while polysilicon (polycrystalline silicon) or the like can be given as an example of a typical crystalline semiconductor. Polysilicon includes so-called high-temperature polysilicon formed using polysilicon which is formed at processing temperatures of greater than or equal to 800° C. as a main material, so-called low-temperature polysilicon formed using polysilicon which is formed at processing temperatures of less than or equal to 600° C. as a main material, polysilicon formed by crystallization of amorphous silicon by using an element that promotes crystallization or the like, and the like. It is needles to say that as mentioned above, a microcrystalline semiconductor or a semiconductor containing a crystal phase in part of a semiconductor layer may be used.

As a material of the semiconductor, as well as an element of silicon (Si), germanium (Ge), or the like, a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor formed of any of the above oxide semiconductors, or the like may be used. For example, an oxide semiconductor formed of zinc oxide, indium oxide, and gallium oxide may be used. In the case of using zinc oxide for the semiconductor layer, a gate insulating layer is preferably formed using $Y_2O_3$, $Al_2O_3$, $TiO_2$, or a stack of any of the above. For the gate electrode layer, the source electrode layer, and the drain electrode layer, ITO, Au, Ti, or the like is preferably used. In addition, In, Ga, or the like can be added into ZnO.

In the case of using a crystalline semiconductor layer for the semiconductor layer, the crystalline semiconductor layer may be formed by any of various methods (such as a laser crystallization method, a thermal crystallization method, and a thermal crystallization method using an element promoting crystallization, such as nickel). Also, a microcrystalline semiconductor, which is an SAS, can be crystallized by laser irradiation to increase its crystallinity. When the element that promotes the crystallization is not introduced, prior to irradiating an amorphous silicon film with laser light, the amorphous silicon film is heated at 500° C. for one hour under a nitrogen atmosphere to release hydrogen contained in the amorphous silicon film such that the concentration of hydrogen becomes $1 \times 10^{20}$ atoms/cm$^3$ or less. This is because the amorphous silicon film is destroyed when the amorphous silicon film containing a high amount of hydrogen is irradiated with laser light.

A technique for introducing a metal element into an amorphous semiconductor layer is not particularly limited as long as it is a technique capable of providing the metal element on a surface or inside of the amorphous semiconductor layer. For example, a sputtering method, a CVD method, a plasma processing method (including a plasma CVD method), an adsorption method, or a method for coating a solution of metal salt, can be used. Among them, the method using a solution is simple and easy, and is useful in terms of easy concentration adjustment of the metal element. In addition, in order to improve the wettability of the surface of the amorphous semiconductor layer to spread an aqueous solution on the entire surface of the amorphous semiconductor layer, an oxide film is preferably formed by UV light irradiation in an oxygen atmosphere, thermal oxidation, treatment using ozone water containing hydroxy radical or hydrogen peroxide solution, or the like.

The crystallization may be performed by adding an element which promotes crystallization (also referred to as a catalyst element or a metal element) to the amorphous semiconductor layer and performing heat treatment (at 550° C. to 750° C. for 3 minutes to 24 hours) in a crystallization step in which an amorphous semiconductor layer is crystallized to form a crystalline semiconductor layer. As the element which promotes (accelerates) the crystallization, one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element promoting crystallization from the crystalline semiconductor layer, a semiconductor layer containing an impurity element is formed in contact with the crystalline semiconductor layer and is made to function as a gettering sink. The impurity element may be an impurity element imparting n-type conductivity, an impurity element imparting p-type conductivity, or a rare gas element such as one or more of phosphorus (P), nitrogen (N), arsenic (As), antimony (Sb), bismuth (Bi), boron (B), helium (He), neon (Ne), argon (Ar), Kr (Krypton), and Xe (Xenon). The semiconductor layer containing a rare gas element is formed over the crystalline semiconductor layer containing an element which promotes crystallization, and heat treatment (at 550° C. to 750° C. for 3 minutes to 24 hours) is performed. The element which promotes crystallization in the crystalline semiconductor layer moves into the semiconductor layer containing a rare gas element, and the element which promotes crystallization in the crystalline semiconductor layer is removed or reduced. Then, the semiconductor layer containing a rare gas element, which serves as a gettering sink, is removed.

Heat treatment and laser light irradiation may be combined to crystallize the amorphous semiconductor layer. Alternatively, one of the heat treatment and the laser light irradiation may be performed plural times.

Also, a crystalline semiconductor layer may be formed over a substrate directly by a plasma method. Alternatively, the crystalline semiconductor layer may be selectively formed by a plasma method.

The gate insulating layer may be formed using silicon oxide or a stacked-layer structure of silicon oxide and silicon nitride. The gate insulating layer may be formed by depositing an insulating film by a plasma CVD method or a low pressure CVD method or may be formed by solid phase oxidation or solid phase nitridation by plasma treatment. This is because a gate insulating layer formed by oxidation or nitridation of a single crystal semiconductor layer by plasma treatment is dense, has high withstand voltage, and is excellent in reliability. For example, a surface of the semiconductor layer is oxidized or nitrided using nitrous oxide ($N_2O$) diluted with Ar by 1 to 3 times (flow ratio) by application of a microwave (2.45 GHz) power of 3 to 5 kW at a pressure of 10 to 30 Pa. By this treatment, an insulating film having a thickness of 1 nm to 10 nm (preferably 2 nm to 6 nm) is formed. Further, nitrous oxide ($N_2O$) and silane ($SiH_4$) are introduced, and a silicon oxynitride film is formed by a vapor deposition method by application of a microwave (2.45 GHz) power of 3 to 5 kW at a pressure of 10 to 30 Pa; accordingly, the gate insulating layer is formed. The combination of the solid phase reaction and the reaction by the vapor deposition method can form a gate insulating layer with a low interface state density and an excellent withstand voltage.

As the gate insulating layer, a high dielectric constant material such as zirconium dioxide, hafnium oxide, titanium dioxide, tantalum pentoxide, or the like may be used. When a high dielectric constant material is used for the gate insulating layer, a gate leakage current can be reduced.

The gate electrode layer can be formed by a CVD method, a sputtering method, a droplet discharge method, or the like. The gate electrode layer may be formed of an element selected from Ag, Au, Cu, Ni, Pt, Pd, Ir, Rh, W, Al, Ta, Mo, Cd, Zn, Fe, Ti, Si Ge, Zr, or Ba; or an alloy material or a compound material containing any of the elements as its main component. Alternatively, a semiconductor film typified by a polycrystalline silicon film doped with an impurity element such as phosphorus, an AgPdCu alloy, or the like may be used. Either a single-layer structure or a multi-layer structure may be employed. For example, a two-layer structure of a tungsten nitride film and a molybdenum film or a three-layer structure in which a tungsten film with a thickness of 50 nm, an alloy (Al—Si) film of aluminum and silicon with a thickness of 500 nm, and a titanium nitride film with a thickness of 30 nm are sequentially stacked may be used. In the case of the three-layer structure, tungsten nitride may be used instead of tungsten for the first conductive film; an aluminum-titanium alloy (Al—Ti) film may be used instead of an aluminum-silicon (Al—Si) alloy film for the second conductive film; or a titanium film may be used instead of a titanium nitride film for the third conductive film.

A light-transmitting material having a light-transmitting property to visible light can also be used for the gate electrode layer. As the light-transmitting conductive material, indium tin oxide (ITO), indium tin oxide containing silicon oxide (ITSO), organic indium, organic tin, zinc oxide, or the like can be used. Further, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may also be used.

In the case where etching processing is needed to form the gate electrode layer, a mask may be formed and dry etching or wet etching may be performed. The electrode layer can be etched to have a tapered shape by using an ICP (inductively coupled plasma) etching method and appropriately controlling the etching condition (the amount of electric power applied to a coiled electrode, the amount of electric power applied to an electrode on a substrate side, the temperature of the electrode on the substrate side, or the like). Note that a gas including chlorine typified by $Cl_2$, $BCl_3$, $SiCl_4$ and $CCl_4$; a gas including fluorine typified by $CF_4$, $SF_6$, and $NF_3$; or $O_2$ can be appropriately used for the etching gas.

Although a transistor having a single-gate structure is described in this embodiment, a transistor having a multi-gate structure such as a double-gate structure may alternatively be employed. In this case, a gate electrode layer may be provided above and below the semiconductor layer or a plurality of gate electrode layers may be provided only on one side (above or below) of the semiconductor layer.

Alternatively, silicides may be provided over the source and drain regions of the transistor. The silicides are formed by forming conductive films over the source and drain regions of the semiconductor layer and reacting silicon in the exposed source and drain regions of the semiconductor layer with the conductive films by heat treatment, a GRTA method, an LRTA method, or the like. The silicide may be formed by laser irradiation or light irradiation with a lamp. As a material used for forming the silicide, any of the followings can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like.

The wiring layers each functioning as a source electrode layer or a drain electrode layer can be formed by depositing a conductive film by a PVD method, a CVD method, an evaporation method, or the like, and then etching the conductive film such that it has desired shapes. Alternatively, the wiring layer can be formed selectively at a predetermined place by a printing method, an electroplating method, or the like. Further, a reflow method and a damascene method may be used as well. As a material of the wiring layers, metal such as Ag, Au, Cu, Ni, Pt, Pd, Ir, Rh, W, Al, Ta, Mo, Cd, Zn, Fe, Ti, Zr, or Ba, a semiconductor such as Si or Ge, or an alloy or a nitride thereof can be used. Further, a light-transmitting material can also be used.

As the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used.

In the semiconductor device according to an embodiment of the present invention, as a semiconductor element, not only a field-effect transistor, but also a memory element in which a semiconductor layer is used can be applied; accordingly, a semiconductor device that can satisfy functions required for various applications can be manufactured and provided.

(Embodiment 4)

Since a semiconductor device such as a wireless tag includes a semiconductor integrated circuit formed using a large number of minutes semiconductor elements, malfunctions of a circuit and damage to the semiconductor elements due to electrostatic discharge (ESD) from an external portion are easily generated. In particular, an antenna including a conductor which has a large surface area or the like, such as a wireless tag, has high possibility that electrostatic discharge is generated. In this embodiment, an example of a structure which protects a semiconductor integrated circuit from such electrostatic discharge will be described.

FIGS. 11A to 11D each illustrate an example of a structure. In this embodiment, by providing a shield having a conductive material close to a semiconductor integrated circuit, the semiconductor integrated circuit is protected.

Figure 11A:
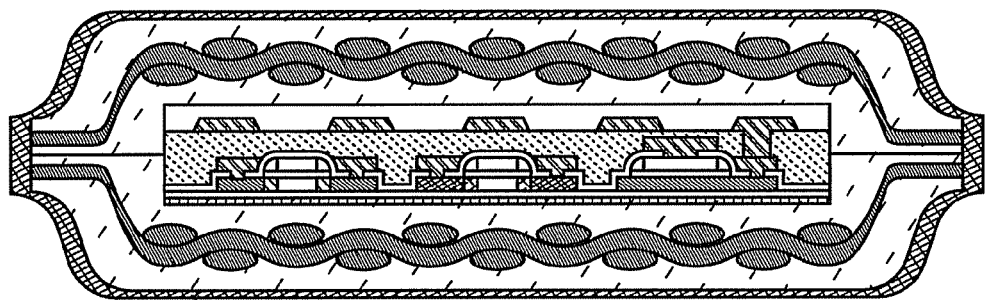
FIGS. 11A to 11D are diagrams each illustrating a manufacturing process of a semiconductor device according to an embodiment of the present invention.

FIG. 11A illustrates an example in which a shield 1101 is formed so as to cover an entire outer surface of a semiconductor integrated circuit chip. The thickness of the shield 1101 may be determined such that reception of a carrier wave or an amplitude modulation wave which is transmitted from a R/W in an antenna is prevented as little as possible.

Note that, in FIG. 11A, the shield 1101 is formed so as to cover a top surface, a bottom surface, and side surfaces of the semiconductor integrated circuit chip, and in order to form the shield 1101 in such a manner, after the shield is formed on the top surface and a part of the side surfaces, the semiconductor integrated circuit is turned over to form the shield on the bottom surface and a part of the side surfaces, whereby the shield is formed covering the entire surface of the semiconductor integrated circuit.

Figure 11B:
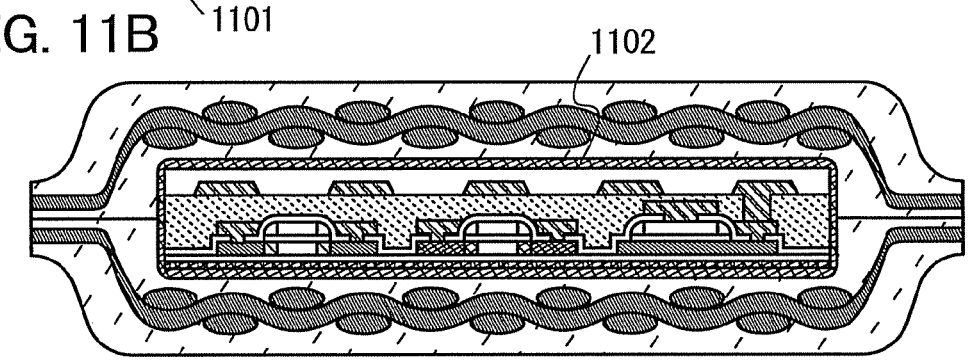

FIG. 11B is an example in which a shield 1102 is provided inside an insulator so as to cover an entire surface of the semiconductor integrated circuit. In order to form the shield 1102 covering the entire surface of the semiconductor integrated circuit in such a manner, the shield 1102 should be formed before the semiconductor integrated circuit is interposed between the insulators and the insulators are attached to each other; however, an embodiment of the present invention is not particularly limited to this example. For example, the shield 1102 may be formed in such a manner: the shield is formed on the top surface and the bottom surface of the semiconductor integrated circuit before the semiconductor integrated circuit chip is interposed between the insulators; the semiconductor integrated circuit is interposed between the insulators and bonded to the insulators; separation is performed by laser light irradiation to melt the shield on the divided surfaces; and the side surfaces of the semiconductor integrated circuit are welded from the top surface and the bottom surface.

Figure 11C:
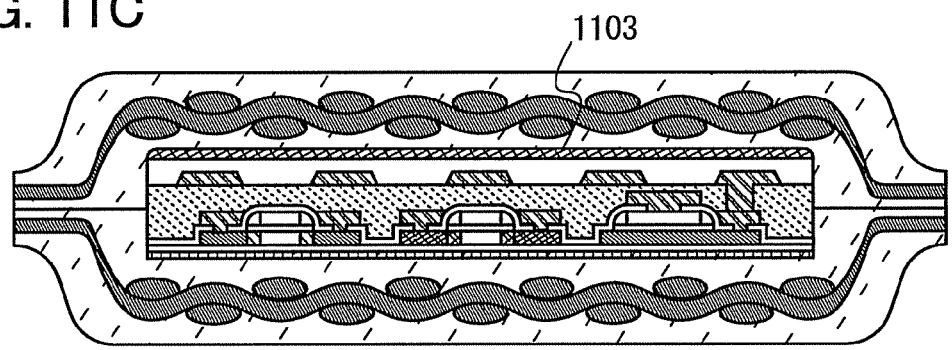

FIG. 11C is an example in which a shield 1103 is provided inside the insulator so as to form the shield only one side of the semiconductor integrated circuit. In this example, the shield 1103 is formed on the antenna side; however, the shield 1103 may be formed on a separation surface side.

By forming the shield on one side of the semiconductor integrated circuit, the shield does not prevent reception of a carrier wave or an amplitude modulation wave from the R/W in the antenna. In such a manner, favorable communication accuracy can be ensured.

Figure 11D:
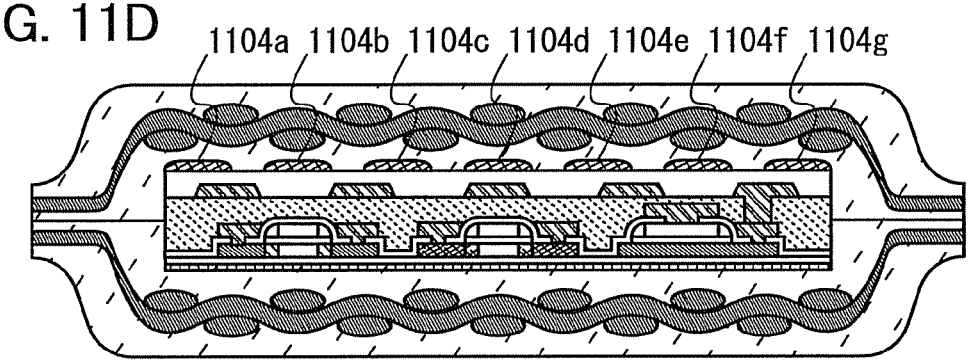

In FIGS. 11A to 11C, the examples in which the shield is formed into a film shape by using a conductive material are described; however, as illustrated in FIG. 11D, the shield may be formed into island shapes such as shields 1104a to 1104g. Since each of the shields 1104a to 1104g is formed using a conductive material, each of the shields 1104a to 1104g has conductivity. However, the shields 1104a to 1104g are dotted over the semiconductor integrated circuit, and are not electrically connected to each other; thus, the shields 1104a to 1104g can be seen as a film equal to an insulator as a whole although the conductive material is used for the shields 1104a to 1104g. By forming the shield to have such a structure, each of the island-shaped shields 1104a to 1104g is formed using a conductive material; therefore, a semiconductor integrated circuit is favorably protected against electrostatic discharge. In addition, since each of the island-shaped shields 1104a to 1104g does not have a shape as a conductive film as a whole, the shields 1104a to 1104g do not prevent reception of a carrier wave or an amplitude modulation wave from the R/W in the antenna; thus, favorable communication accuracy can be ensured.

As a material for forming the shield 1101, a conductor or a semiconductor is preferable. For example, a metal film, a metal oxide film, a semiconductor film, a metal nitride film, and the like can be given. As a specific material, an element selected from titanium, molybdenum, tungsten, aluminum, copper, silver, gold, nickel, platinum, palladium, iridium, rhodium, tantalum, cadmium, zinc, iron, silicon, germanium, zirconium, or barium; an alloy material containing any of the above elements as its main component; a compound material containing any of the above elements as its main component; a nitride material containing any of the above elements as its main component; or an oxide material containing any of the above elements as its main component can be used.

As the nitride material, tantalum nitride, titanium nitride, or the like can be used.

As the oxide material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide (ITO (indium tin oxide)), or the like may be used.

Alternatively, a semiconductor film having conductivity, which is obtained by adding an impurity element or the like to a semiconductor, or the like can be used. For example, a polycrystalline silicon film doped with an impurity element such as phosphorus can be used.

Further, as the shield, a conductive high molecule (also referred to as a conductive polymer) may be used. As the conductive high molecule, a so-called π-electron conjugated conductive polymer can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive high-molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly (3-anilinesulfonic acid).

An organic resin or a dopant (a halogen, a Lewis acid, an inorganic acid, an organic acid, a transition metal halide, an organic cyano compound, a nonionic surfactant, and the like) may be contained in the shield containing a conductive high molecule.

The shield can be formed by a dry process such as a sputtering method, a plasma CVD method, or an evaporation method, or a wet process such as a coating method, a printing method, or a droplet discharge method (inkjet method).

(Embodiment 5)

By the semiconductor device according to an embodiment of the present invention, a semiconductor device functioning as a wireless tag (hereinafter, it is referred to as a wireless chip, a wireless processor, or a wireless memory) can be formed. Note that an applicable range of a semiconductor device according to an embodiment of the present invention is wide, and the semiconductor device can be applied to any product as long as it clarifies information of an object, such as the history thereof, noncontactly and is useful for production, management, or the like. For example, the semiconductor device according to an embodiment of the present invention may be incorporated in bills, coins, securities, certificates, bearer bonds, packing containers, books, recording media, personal belongings, vehicles, foods, clothing, healthcare products, commodities, medicine, and electronic devices. Examples of these products are described with reference to FIGS. 10A to 10G.

Figure 10A:
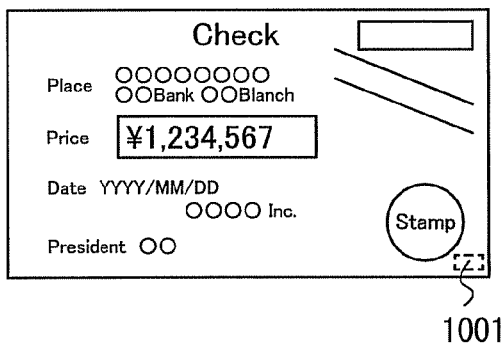
FIGS. 10A to 10G are diagrams each illustrating an application example of a semiconductor device according to an embodiment of the present invention.
Figure 10B:
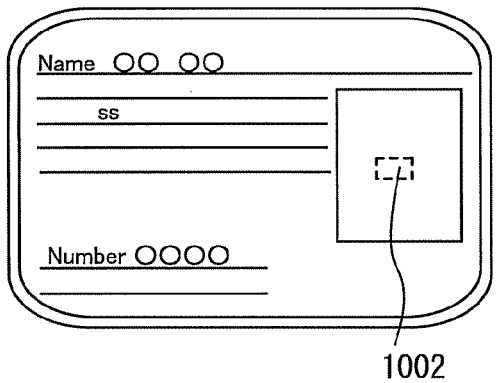
Figure 10C:
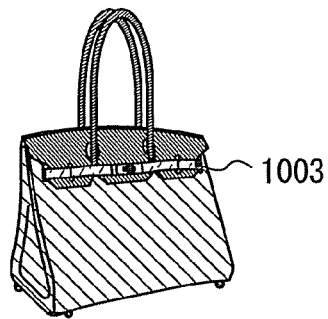
Figure 10D:
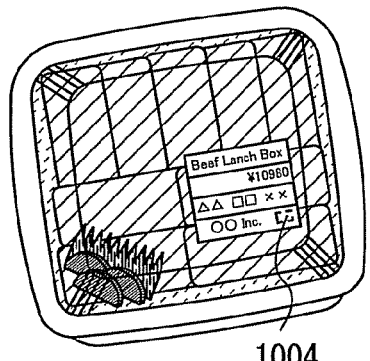
Figure 10E:
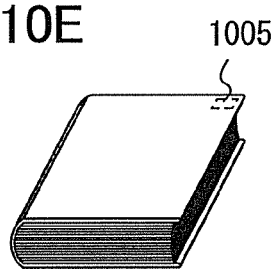
Figure 10F:
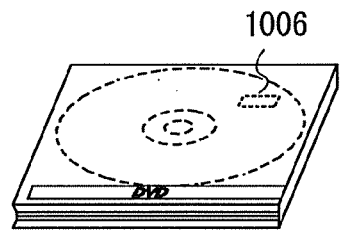
Figure 10G:
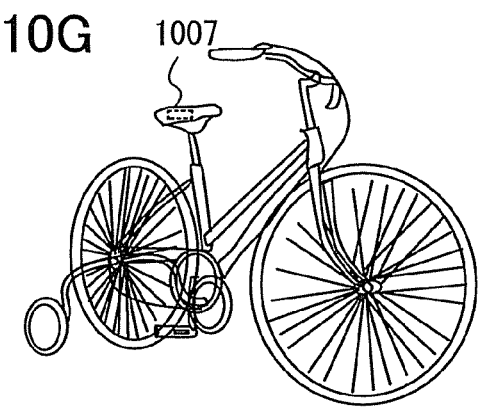

The bills and coins are money that circulates in the market, and includes one that can be used in the same way as money in a specific area (cash voucher), a commemorative coin, and the like. The securities refer to checks, certificates, promissory notes, and the like, which can be provided with a chip 1001 including a processor circuit (FIG. 10A). The certificates refer to driver's licenses, certificates of residence, and the like, and can be provided with a chip 1002 including a processor circuit (see FIG. 10B). The personal belongings refer to bags, glasses, and the like, and can be provided with a chip 1003 including a processor circuit (FIG. 10C). The bearer bonds refer to stamps, rice coupons, various merchandise coupons, and the like. The packing containers refer to wrapping paper for food containers and the like, plastic bottles, and the like, and can be provided with a chip 1004 including a processor circuit (see FIG. 10D). The books refer to hardbooks, paperbooks, and the like, and can be provided with a chip 1005 including a processor circuit (FIG. 10E). The recording media refer to DVD software, video tapes, and the like, which can be provided with a chip 1006 including a processor circuit (FIG. 10F). The vehicles refer to ships, wheeled vehicles such as bicycles, and the like, which can be provided with a chip 1007 including a processor circuit (FIG. 10G). The food refers to food articles, beverages, and the like. The clothing refer to clothes, shoes, and the like. The healthcare products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (television receivers or thin television receivers), cellular phones, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by providing the packing containers, the recording media, the personal belongings, the food, the clothing, the commodities, the electronic devices, or the like with the semiconductor device. In addition, by providing the vehicles with the semiconductor device, forgery or theft can be prevented. In addition, when the semiconductor device is implanted into creatures such as animals, each creature can be identified easily. For example, by implanting/attaching the semiconductor device with a sensor in/to a creature such as livestock, its health condition such as a current body temperature as well as its birth year, sex, breed, or the like can be easily managed.

Note that this embodiment can be implemented in combination with another embodiment or example which is disclosed in this specification as appropriate.

EXAMPLE 1

In this example, results of comparative verification using a high-frequency circuit simulation are described to show operation of a wireless tag including an overvoltage protection circuit according to an embodiment of the present invention illustrated in FIG. 3 in Embodiment 1 and a wireless tag including a conventional overvoltage protection circuit.

Figure 4:
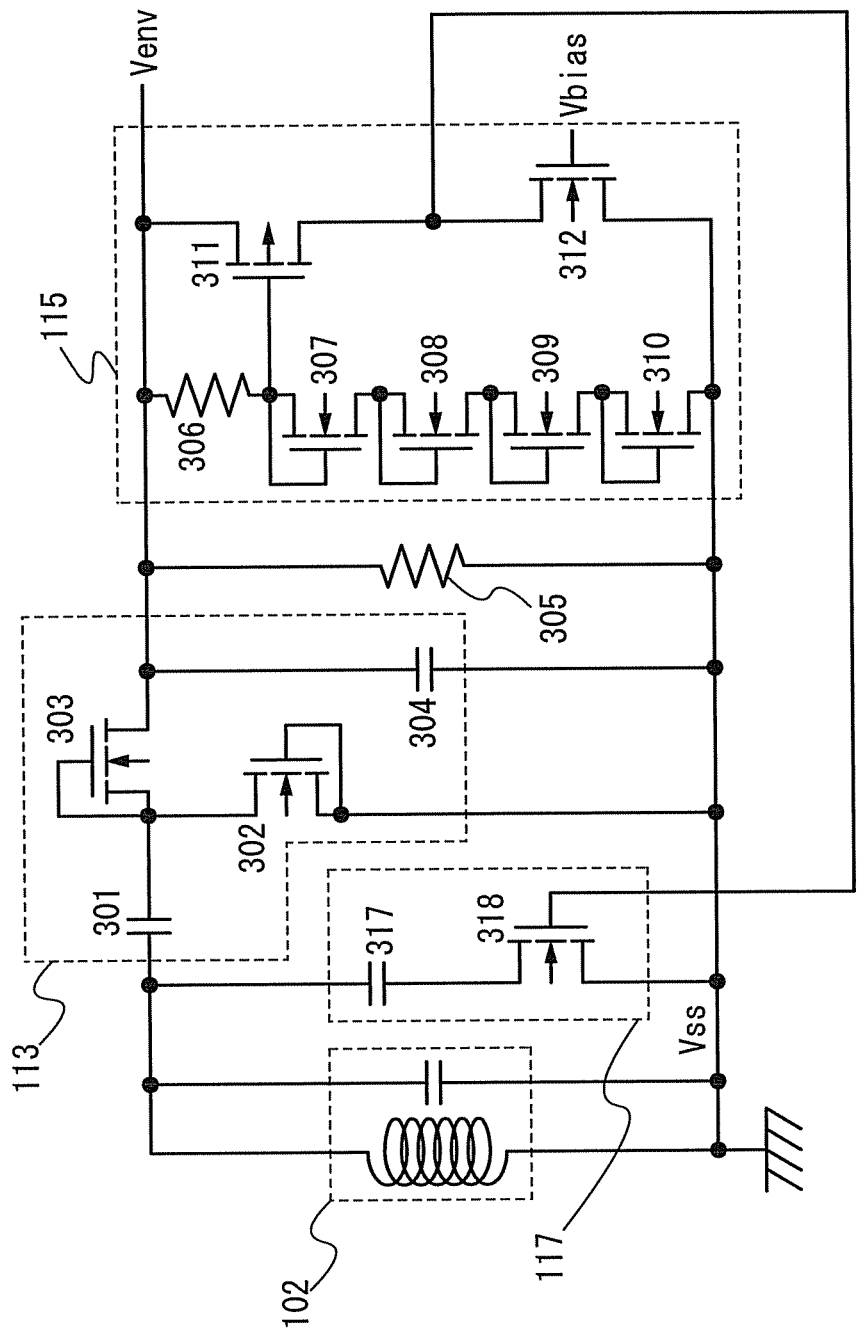
FIG. 4 shows an example of a conventional overvoltage protection circuit.

FIG. 4 shows a structure of an antenna circuit, a rectifier circuit, a voltage detection circuit, and an overvoltage protection circuit of a conventional wireless tag which is used for comparison. When comparing the structure in FIG. 4 with the structure in FIG. 3, which is an embodiment of the present invention, the structure in FIG. 4 is different from the structure in FIG. 3 in that the gate of the transistor 318 included in the protection circuit 117 is controlled using an output of the voltage detection circuit 115 directly.

Electric power corresponding to the carrier wave from a R/W is introduced from an antenna portion of the circuit in each of FIG. 3 and FIG. 4, and changes in signal modulation factors in the antenna circuit 102 depending on strength of electric power input to the antenna circuit 102 are compared with each other.

Figures 5A, 5B:
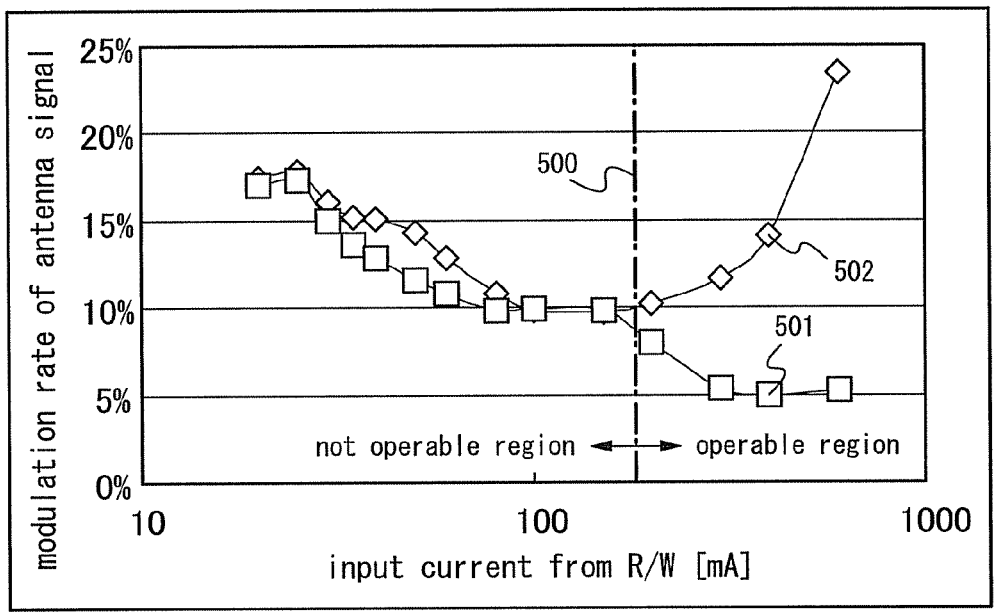
FIGS. 5A and 5B are graphs each comparing a change in a signal modulation factor at an antenna with respect to an input electric current between a wireless tag using an overvoltage protection circuit according to an embodiment of the present invention and a wireless tag using a conventional overvoltage protection circuit.

FIGS. 5A and 5B show calculation results. In FIG. 5A, the term "VppMax" means the maximum amplitude of the signal in the antenna circuit 102, and the term "VppMin" means the minimum amplitude of the signal in the antenna circuit 102; and they are defined by a formula, (modulation factor)=(Vpp-Max−VppMin)/(VppMax+VppMin).

FIG. 5B is a graph showing changes in modulation factors of the structure according to an embodiment of the present invention and the conventional structure with respect to input power from the R/W in FIG. 5A. As a simulation condition, an input current from the R/W which is parameter corresponding to input power from the R/W was changed between 20 mA and 600 mA. As for a relationship between the input current and electric power (dBm), although direct conversion is not performed in FIGS. 5A and 5B, as the input current is increased, the input power from the R/W is increased, in accordance with setting of coefficient of coupling between the R/W and the antenna or the like. The input current from the R/W at which the overvoltage protection circuit starts operating is 200 mA. A plot 501 shows a signal modulation factor of the antenna in the wireless tag including the overvoltage protection circuit having the conventional structure, and a plot 502 shows a signal modulation factor of the antenna in the wireless tag including the overvoltage protection circuit having the structure according to an embodiment of the present invention when a signal having a modulation factor of 20% is input from the R/W.

In a region where the input power from the R/W is comparatively low, that is, in a region where the Venv is less than or equal to a voltage at which the overvoltage protection circuit starts operating, signal modulation factors of the antenna are about 10% to 17.4% in both the structure of the present invention and the conventional structure. In a region where the input power from the R/W is high, that is, in a region where the Venv is greater than or equal to a voltage at which the overvoltage protection circuit starts operating, a resonance point of the antenna is changed due to operation of the overvoltage protection circuit. The border is shown as a broken line 500 in FIG. 5B.

In a region where the plot exceeds the broken line 500, a signal modulation factor of the antenna in the wireless tag including the conventional structure of the overvoltage protection circuit, which is represented by the plot 501, significantly decreases to about 5%. This shows that reception of the signal on the R/W side is difficult to detect because the difference between the maximum amplitude of the signal and the minimum amplitude of the signal becomes small. On the other hand, a signal modulation factor of the antenna in the wireless tag including the structure of the overvoltage protection circuit according to an embodiment of the present invention does not fall below 10%, and a signal modulation factor of about 10% to 15% is stably maintained. In a region where the input current is 600 mA, the signal modulation factor is increased because the input power from the R/W is increased and the voltage is increased to exceed a control range of the overvoltage protection circuit and the constant voltage circuit.

As apparent from the above results, in an overvoltage protection circuit having the structure according to an embodiment of the present invention, effects of stabilizing behavior of the overvoltage protection circuit when a voltage is close to the voltage at which operation starts and suppressing an adverse effect on modulation operation in an antenna can be obtained by making hysteresis occur between the timing when the operation starts and the timing when the operation stops.

EXAMPLE 2

In this example, a response of an actual chip when overvoltage operation circuits operate in accordance with changes in input power was investigated and comparison was performed between a wireless tag including an overvoltage protection circuit according to an embodiment of the present invention shown in FIG. 3 and a wireless tag including a conventional overvoltage protection circuit shown in FIG. 4 by using an experimental chip of a wireless tag, which conforms to specifications of ISO 15693 with a frequency of 13.56 MHz. The summary and the results thereof will be described.

The summary of the experimental chip is briefly described. The experimental chip is a wireless tag which conforms to specifications of ISO 15693 with a frequency of 13.56 MHz, and a main structure thereof is shown in FIG. 1. As for a structure of an overvoltage protection circuit, the overvoltage protection circuit having the structure according to an embodiment of the present invention shown in FIG. 3 and the overvoltage protection circuit having the conventional structure shown in FIG. 4 are compared with each other although there are portions which are common in the two structures. Note that, in an actual experimental chip, an overvoltage protection circuit having the conventional structure shown in FIG. 4 is manufactured by adding a low-pass filter as a countermeasure against noise in a path between the drain of the transistor 311 and the gate of the transistor 318.

The summary of the experiment is described. A ratio of response of each of protocols in the case of changing the input power from the R/W was investigated by using the above-described two kinds of samples. As for the protocol, in accordance with a method prescribed by ISO 15693, ratios of response were investigated under conditions where: modulation factors of the carrier waves from the R/Ws to the tags were 100% and 10%; in each of which, a single subcarrier wave and a dual subcarrier wave were used; and in each of which, as a data encoding method, a "one out of four" method and a "one out of two hundreds fifty-six" method were used. As for a transfer rate, only a high-speed mode was used for evaluation. In the experiment, twenty signals were continuously output from the R/W, and a proportion of the number of times where the chip normally responded is showed as a percentage.

Figures 7A, 7B:
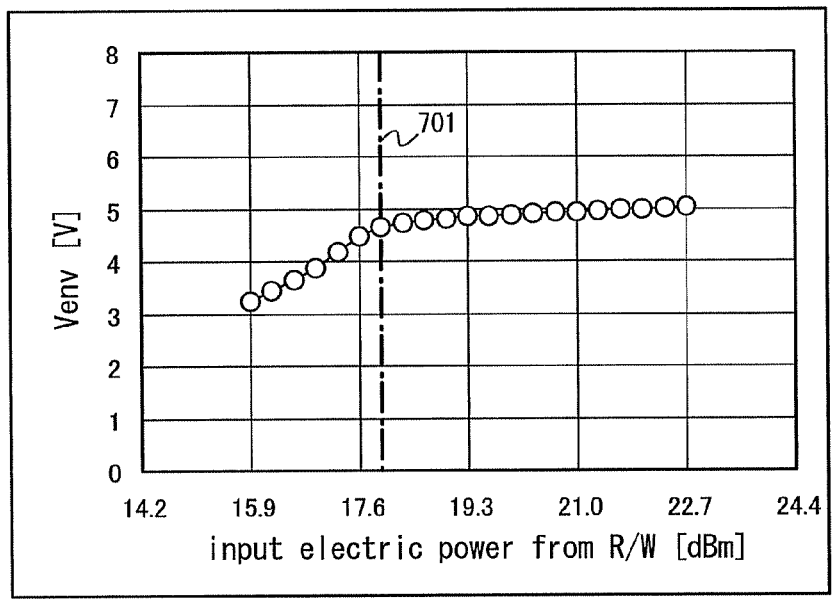
FIGS. 7A and 7B are graphs each showing a relationship between input electric power and a ratio of response in a wireless tag using a conventional overvoltage protection circuit.
Figures 8A, 8B:
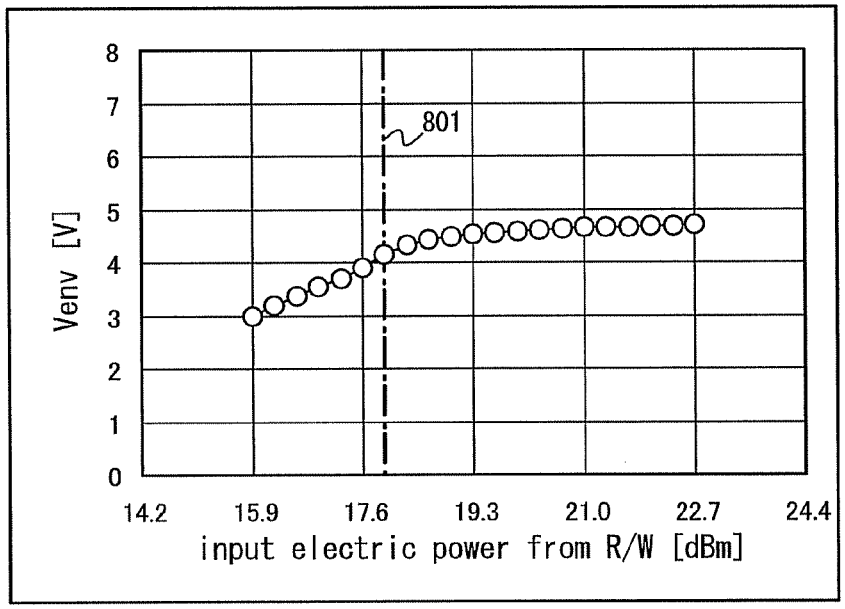
FIGS. 8A and 8B are graphs each showing a relationship between input electric power and a ratio of response in a wireless tag using an overvoltage protection circuit according to an embodiment of the present invention.

FIGS. 7A and 7B show measurement results using a wireless tag which includes a conventional overvoltage protection circuit, and FIGS. 8A and 8B show measurement results using a wireless tag which includes an overvoltage protection circuit according to an embodiment of the present invention. In FIG. 7A, it can be seen that when the input power from the R/W exceeds the input power represented by a dashed line 701, the overvoltage protection circuit starts operating and increase of the Venv is stabilized around 5V Similarly, in FIG. 8A, when the input power from the R/W exceeds the input power represented by a dashed line 801, the overvoltage protection circuit starts operating and increase of the Venv is stabilized around 5V.

FIG. 7B shows measurement results using the wireless tag which includes the conventional overvoltage protection circuit. In the case where the signal from the R/W to the wireless tag has 100% modulation, in all the evaluated protocols and in all the range of the input power, a response of at least one time out of twenty times (in FIG. 7B, Min. 25%) was obtained.

However, in the case where the signal from the R/W to the wireless tag has 10% modulation, in the periphery of a region where the input power from the R/W exceeds 20 dBm, a region where a normal response cannot be obtained (a ratio of response of 0%) is seen. This phenomena is caused because a signal modulation factor in an antenna is drastically decreased in accordance with the operation of the overvoltage protection circuit (see FIGS. 5A and 5B in Example 1).

FIG. 8B shows measurement results using the wireless tag which includes the overvoltage protection circuit according to an embodiment of the present invention. It can be seen that in all the evaluated protocols and in all the range of the input power, a response of at least one time out of twenty times was obtained, and a ratio of response in a region where input power is high and 10% modulation was employed, that is, in a region where a response was not obtained in the case where the wireless tag including the conventional overvoltage protection circuit is used, is significantly increased.

From the above comparison, by the overvoltage protection circuit according to an embodiment of the present invention, excessive increase of the Venv due to increase of the input power can be favorably suppressed, the operation can be stabilized as compared to the conventional overvoltage protection circuit, an adverse effect on the signal having a low modulation factor can be suppressed, and communication accuracy between the wireless tag and the R/W can be improved.

This application is based on Japanese Patent Application serial no. 2008-241499 filed with Japan Patent Office on Sep. 19, 2008, the entire contents of which are hereby incorporated by reference.

EXPLANATION OF REFERENCE

100: wireless tag, 101: logic circuit, 102: antenna circuit, 103: demodulation circuit, 104: modulation circuit, 105: power supply circuit, 106: overvoltage protection circuit, 111: antenna, 112: resonant capacitor, 113: rectifier circuit, 114: constant voltage circuit, 115: voltage detection circuit, 116: memory circuit, 117: protection circuit, 201: Venv, 202: regulate voltage Vdd, 211: amplitude modulation wave, 212: pulse signal, 301: capacitor, 302: transistor, 303: transistor, 304: capacitor, 305: resistor, 306: resistor, 307: transistor, 308: transistor, 309: transistor, 310: transistor, 311: transistor, 312: transistor, 313: resistor, 314: transistor, 315: transistor, 316: capacitor, 317: capacitor, 318: transistor, 500: broken line, 501: plot, 502: plot, 604: region, 605: region, 609: region, 610: region, 701: dashed line, 801: dashed line, 900: substrate, 901: separation layer, 902: transistor, 903: transistor, 904: capacitor, 905: insulating layer, 910: semiconductor integrated circuit, 911: antenna, 912: protective film, 920: insulator, 921: fibrous body, 922: organic resin, 930: insulator, 931: fibrous body, 932: organic resin, 941: divided surface, 1001: chip, 1002: chip, 1003: chip, 1004: chip, 1005: chip, 1006: chip, 1007: chip, 1101: shield, 1102: shield, 1103: shield, 1201: substrate, 1202: separation layer, 1203: insulating film, 1204: semiconductor film, 1205: gate insulating film, 1207: gate electrode, 1208: insulating film, 1209: insulating film, 1210: insulating film, 1211: insulating film, 1212: insulating film, 1213: insulating film, 1214: opening portion, 1215: region, 1217: conductive film, 1218: insulating film, 1220: antenna, 1221: conductive film, 1222: conductive film, 1223: insulating film, 1242: region, 1249: element layer, 1104*a*: shield, 1104*b*: shield, 1104*c*: shield, 1104*d*: shield, 1104*e*: shield, 1104*f*: shield, 1104*g*: shield, 1204*a*: semiconductor film, 1204*b*: semiconductor film, 1206*a*: channel formation region, 1206*b*: impurity region, 1206*c*: impurity region, 1230*a*: thin film transistor, 1230*b*: thin film transistor, 1231*a*: conductive film, and 1231*b*: conductive film

The invention claimed is:
1. A semiconductor device comprising:
 a voltage detection circuit outputting a potential in accordance with a level of electric power supplied from an external portion;
 a memory circuit holding a potential in accordance with a maximum value of the potential output from the voltage detection circuit; and
 a protection circuit electrically connected to the memory circuit,
 wherein the memory circuit comprises a first transistor and a capacitor,
 wherein one of a source and a drain of the first transistor is electrically connected to one electrode of the capacitor, and
 wherein the other of the source and the drain of the first transistor is electrically connected to another electrode of the capacitor.
2. A semiconductor device comprising:
 a voltage detection circuit outputting a potential in accordance with a level of electric power supplied from an external portion;
 a memory circuit holding a potential in accordance with a maximum value of the potential output from the voltage detection circuit; and
 a protection circuit electrically connected to the memory circuit,
 wherein the memory circuit comprises a first transistor, a capacitor and a second transistor,
 wherein the protection circuit comprises a third transistor,
 wherein one of a source and a drain of the first transistor is electrically connected to one electrode of the capacitor, and
 wherein the other of the source and the drain of the first transistor is electrically connected to another electrode of the capacitor,
 wherein a gate and one of a source and a drain of the second transistor are electrically connected to the voltage detection circuit,
 wherein the other of the source and the drain of the second transistor is electrically connected to the one of the source and the drain of the first transistor, and
 wherein a gate of the third transistor is electrically connected to the one electrode of the capacitor.
3. A semiconductor device comprising:
 an antenna circuit receiving electric power from an external portion;
 a voltage detection circuit outputting a potential in accordance with a level of the electric power;
 a memory circuit holding a potential in accordance with a maximum value of the potential output from the voltage detection circuit; and
 a protection circuit electrically connected to the memory circuit,
 wherein the memory circuit comprises a first transistor, a capacitor and a second transistor,
 wherein the protection circuit comprises a third transistor,
 wherein one of a source and a drain of the first transistor is electrically connected to one electrode of the capacitor, and
 wherein the other of the source and the drain of the first transistor is electrically connected to another electrode of the capacitor, wherein a gate and one of a source and a drain of the second transistor are electrically connected to the voltage detection circuit, wherein the other of the source and the drain of the second transistor is electrically connected to the one of the source and the drain of the first transistor, and wherein a gate of the third transistor is electrically connected to the one electrode of the capacitor.

4. The semiconductor device according to any one of claims 1 to 3, wherein the memory circuit includes a reset terminal, wherein the memory circuit resets the potential which is held when a reset signal is input to the reset terminal, and wherein the reset terminal is electrically connected to the gate of the first transistor.

5. A wireless tag comprising:

the semiconductor device according to any one of claims 1 to 3;

a wireless communication circuit by which communication with the external portion can be performed wirelessly;

a power supply circuit which generates a DC voltage based on the electric power supplied from the external portion; and a logic circuit which is driven by using the generated DC voltage and performs data processing.

6. The semiconductor device according to claim 1, wherein impedance of the protection circuit is changed in accordance with the potential which is held by the memory circuit.

7. The semiconductor device according to claim 2, wherein the protection circuit consumes or reflects an excess of the electric power by changing impedance of the protection circuit in accordance with the potential which is held by the memory circuit.

8. The semiconductor device according to claim 3, wherein the protection circuit changes resonance frequency of the antenna circuit and reflecting an excess of the electric power by changing impedance of the protection circuit in accordance with the potential which is held by the memory circuit.

9. The semiconductor device according to claim 1, wherein the other electrode of the capacitor is held at a constant potential.

10. The semiconductor device according to claim 2, wherein the other electrode of the capacitor is held at a constant potential.

11. The semiconductor device according to claim 3, wherein the other electrode of the capacitor is held at a constant potential.

12. The semiconductor device according to claim 1, wherein the first transistor comprises an oxide semiconductor layer which includes a channel formation region.

13. The semiconductor device according to claim 2, wherein each of the first transistor, the second transistor and the third transistor comprises an oxide semiconductor layer which includes a channel formation region.

14. The semiconductor device according to claim 3, wherein each of the first transistor, the second transistor and the third transistor comprises an oxide semiconductor layer which includes a channel formation region.

* * * * *

UNITED STATES PATENT AND TRADEMARK OFFICE
CERTIFICATE OF CORRECTION

PATENT NO.        : 8,439,270 B2
APPLICATION NO.   : 12/558156
DATED             : May 14, 2013
INVENTOR(S)       : Tatsuji Nishijima It is certified that error appears in the above-identified patent and that said Letters Patent is hereby corrected as shown below:

In the Specification:

Column 13, line 2; Change "boron (13) can" to --boron (B) can--.
Column 17, lines 49 and 50; Change "of 200 µm. The" to --of 200 nm. The--.

In the Claims:

Column 30, line 20, Claim 1; Change "to another electrode" to --to the other electrode--.
Column 30, line 38, Claim 2; Change "to another electrode" to --to the other electrode--.
Column 30, line 65, Claim 3; Change "to another electrode" to --to the other electrode--.

Signed and Sealed this
Sixteenth Day of July, 2013

Teresa Stanek Rea
*Acting Director of the United States Patent and Trademark Office*